US012631578B2

(12) United States Patent
Kato et al.

(10) Patent No.: US 12,631,578 B2
(45) Date of Patent: May 19, 2026

(54) ANALYZING METHOD AND ANALYZER

(71) Applicant: JEOL Ltd., Tokyo (JP)

(72) Inventors: Koki Kato, Tokyo (JP); Shinya Fujita, Tokyo (JP); Takanori Murano, Tokyo (JP); Shigeru Honda, Tokyo (JP)

(73) Assignee: JEOL Ltd., Tokyo (JP)

( * ) Notice: Subject to any disclaimer, the term of this patent is extended or adjusted under 35 U.S.C. 154(b) by 323 days.

(21) Appl. No.: 18/386,032

(22) Filed: Nov. 1, 2023

(65) Prior Publication Data

US 2024/0142395 A1 May 2, 2024

(30) Foreign Application Priority Data

Nov. 2, 2022 (JP) ................................. 2022-176573

(51) Int. Cl.
*G01N 23/2209* (2018.01)
*G01N 23/2252* (2018.01)
*H01J 37/147* (2006.01)

(52) U.S. Cl.
CPC ..... *G01N 23/2209* (2018.02); *G01N 23/2252* (2013.01); *H01J 37/1474* (2013.01); *G01N 2223/079* (2013.01); *G01N 2223/102* (2013.01); *G01N 2223/32* (2013.01)

(58) Field of Classification Search
CPC .. H01J 37/00; H01J 37/02; H01J 37/26; H01J 37/28; H01J 37/1474; G01N 23/2209; G01N 23/222; G01N 2223/079; G01N 2223/102; G01N 2223/32; G01N 2223/402
USPC ................................. 250/306, 307, 310, 311
See application file for complete search history.

(56) References Cited

U.S. PATENT DOCUMENTS

| | | | | | |
|---|---|---|---|---|---|
| 4,037,101 | A | * | 7/1977 | Okumura | ............. G01N 23/225 |
| | | | | | 250/307 |
| 2021/0025838 | A1 | | 1/2021 | Tsukamoto et al. | |
| 2021/0096063 | A1 | | 4/2021 | Tsutsumi et al. | |
| 2023/0039168 | A1 | * | 2/2023 | Ogoshi | ................. G06F 18/231 |

FOREIGN PATENT DOCUMENTS

| | | | |
|---|---|---|---|
| JP | 2009264926 | A | 11/2009 |
| JP | 2021018222 | A | 2/2021 |
| JP | 202156208 | A | 4/2021 |
| JP | 2022148891 | A | 10/2022 |

OTHER PUBLICATIONS

Office Action issued in JP2022176573 on Apr. 30, 2025.
Extended European Search Report issued in EP23206477.4 on Mar. 6, 2024.

\* cited by examiner

*Primary Examiner* — Jason L Mccormack
(74) *Attorney, Agent, or Firm* — The Webb Law Firm

(57) ABSTRACT

An analyzing method using an analyzer including a wavelength-dispersive X-ray spectrometer that has an analyzing element to analyze an X-ray emitted from a specimen and detects an X-ray of energy corresponding to a position of the analyzing element. The analyzing method includes acquiring a plurality of map data by repeatedly performing a mapping analysis while changing the position of the analyzing element, the mapping analysis being an analysis to detect an X-ray of specific energy with the position of the analyzing element fixed to acquire map data while scanning the specimen with an electron beam; and generating, based on the plurality of map data, a spectrum map in which a position on the specimen and an X-ray spectrum are associated with each other.

17 Claims, 23 Drawing Sheets

ANALYZING POSITION L

ANALYZING POSITION L

ANALYZING METHOD AND ANALYZER

CROSS-REFERENCE TO RELATED APPLICATION

This application claims priority to Japanese Patent Application No. 2022-176573, filed on Nov. 2, 2022, the disclosure of which is hereby incorporated by reference in its entirety.

BACKGROUND OF THE INVENTION

Field of the Invention

The present invention relates to an analyzing method and an analyzer.

Description of Related Art

A wavelength-dispersive X-ray spectrometer (WDS) analyzes a characteristic X-ray emitted from a specimen to perform an analysis of an element. The WDS has higher energy resolution compared with an energy-dispersive X-ray spectrometer (EDS), and is therefore allowed to accurately separate a characteristic X-ray having close energy and identify an element. Moreover, the WDS has a finer SN ratio compared with the EDS, and is therefore allowed to detect a slight amount of an element.

JP-A-2021-018222 discloses an analyzer in which five WDS are mounted. In a mapping analysis using the WDS, it is possible to analyze only one energy value with respect to one WDS. Since the five WDS are mounted in the analyzer disclosed in JP-A-2021-018222, the analyzer is capable of performing a mapping analysis of five elements at the same time.

The EDS is capable of measuring all elements at the same time, and therefore allowed to easily acquire an X-ray spectrum. Accordingly, the EDS is allowed to easily acquire a spectrum map in which positions on a specimen and X-ray spectra are associated with each other. It is desirable that the WDS be also allowed to easily acquire a spectrum map.

SUMMARY OF THE INVENTION

According to a first aspect of the present disclosure, there is provided an analyzing method using an analyzer including a wavelength-dispersive X-ray spectrometer that has an analyzing element to analyze an X-ray emitted from a specimen and detects an X-ray of energy corresponding to a position of the analyzing element, the analyzing method including:

acquiring a plurality of map data by repeatedly performing a mapping analysis while changing the position of the analyzing element, the mapping analysis being an analysis to detect an X-ray of specific energy with the position of the analyzing element fixed to acquire map data while scanning the specimen with an electron beam; and generating, based on the plurality of map data, a spectrum map in which a position on the specimen and an X-ray spectrum are associated with each other.

According to a second aspect of the present disclosure, there is provided an analyzer including:

an electron optical system that irradiates a specimen with an electron beam;

a wavelength-dispersive X-ray spectrometer that has an analyzing element to analyze an X-ray emitted from the specimen and detects an X-ray of energy corresponding to a position of the analyzing element; and a control unit that controls the electron optical system and the wavelength-dispersive X-ray spectrometer, the control unit performing processing for:

acquiring a plurality of map data by repeatedly performing a mapping analysis while causing the wavelength-dispersive X-ray spectrometer to change the position of the analyzing element, the mapping analysis being an analysis to cause the wavelength-dispersive X-ray spectrometer to detect an X-ray of specific energy with the position of the analyzing element fixed to acquire map data while scanning the specimen with an electron beam; and generating, based on the plurality of map data, a spectrum map in which a position on the specimen and an X-ray spectrum are associated with each other.

DESCRIPTION OF THE INVENTION

Figure 1:
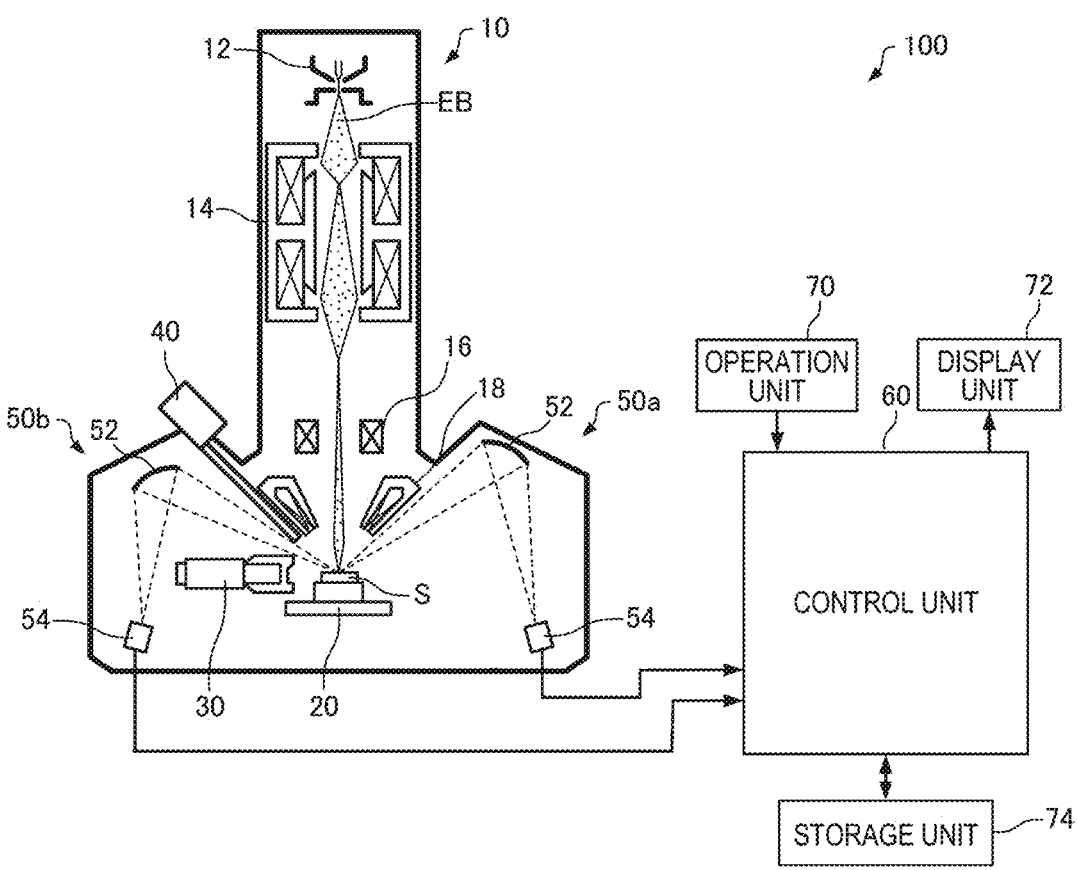
FIG. 1 is a diagram illustrating a configuration of an analyzer used in an analyzing method according to the first embodiment.

According to an embodiment of the present disclosure, there is provided an analyzing method using an analyzer including a wavelength-dispersive X-ray spectrometer that has an analyzing element to analyze an X-ray emitted from a specimen and detects an X-ray of energy corresponding to a position of the analyzing element, the analyzing method including:

acquiring a plurality of map data by repeatedly performing a mapping analysis while changing the position of the analyzing element, the mapping analysis being an analysis to detect an X-ray of specific energy with the position of the analyzing element fixed to acquire map data while scanning the specimen with an electron beam; and generating, based on the plurality of map data, a spectrum map in which a position on the specimen and an X-ray spectrum are associated with each other. According to the analyzing method, acquisition of a spectrum map is allowed using a wavelength-dispersive X-ray spectrometer. Further, according to the analyzing method, a mapping analysis is repeatedly performed while changing a position of an analyzing element to acquire a plurality of map data, and a spectrum map is generated based on the plurality of map data. Therefore, compared with a case in which an X-ray spectrum is acquired by performing a point analysis at each analysis point on a specimen and a spectrum map is generated, acquisition of the spectrum map is facilitated.

According to an embodiment of the present disclosure, there is provided an analyzer including:

an electron optical system that irradiates a specimen with an electron beam;

a wavelength-dispersive X-ray spectrometer that has an analyzing element to analyze an X-ray emitted from the specimen and detects an X-ray of energy corresponding to a position of the analyzing element; and a control unit that controls the electron optical system and the wavelength-dispersive X-ray spectrometer, the control unit performing:

acquiring a plurality of map data by repeatedly performing a mapping analysis while causing the wavelength-dispersive X-ray spectrometer to change the position of the analyzing element, the mapping analysis being an analysis to cause the wavelength-dispersive X-ray spectrometer to detect an X-ray of specific energy with the position of the analyzing element fixed to acquire map data while scanning the specimen with an electron beam; and generating, based on the plurality of map data, a spectrum map in which a position on the specimen and an X-ray spectrum are associated with each other.

According to the analyzer, acquisition of a spectrum map is allowed using a wavelength-dispersive X-ray spectrometer. Further, according to the analyzer, a mapping analysis is repeatedly performed while changing a position of an analyzing element to acquire a plurality of map data, and a spectrum map is generated based on the plurality of map data. Therefore, compared with a case in which an X-ray spectrum is acquired by performing a point analysis at each analysis point on a specimen and a spectrum map is generated, acquisition of the spectrum map is facilitated.

Preferred embodiments of the invention are described in detail below with reference to the drawings. The embodiments described below are not intended to unduly limit the scope of the invention as stated in the claims. Further, all of the components described below are not necessarily essential requirements of the invention.

1. First Embodiment 1.1. Analyzer

Figure 2:
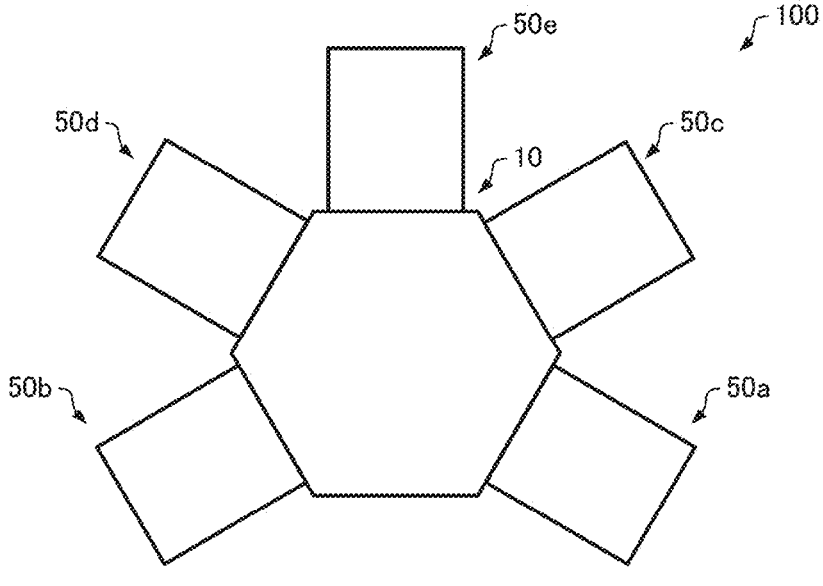
FIG. 2 is a diagram illustrating a configuration of the analyzer used in the analyzing method according to the first embodiment.

First, an analyzer used in an analyzing method according to the first embodiment will be described with reference to the drawings. FIGS. 1 and 2 are diagrams illustrating an analyzer 100 used in the analyzing method according to the first embodiment. The analyzer 100 is a scanning electron microscope in which a plurality of wavelength-dispersive X-ray spectrometers (WDS) are mounted. Note that the analyzer 100 may also be an electron probe micro analyzer (EPMA) in which a plurality of WDS are mounted.

As illustrated in FIGS. 1 and 2, the analyzer 100 includes an electron optical system 10, a specimen stage 20, an electron detector 30, an energy-dispersive X-ray spectrometer (EDS) 40, a WDS 50a, a WDS 50b, a WDS 50c, a WDS 50d, a WDS 50e, a control unit 60, an operation unit 70, a display unit 72, and a storage unit 74. Note that only the electron optical system 10, the WDS 50a, the WDS 50b, the WDS 50c, the WDS 50d, and WDS 50e are illustrated in FIG. 2 for the sake of convenience.

The electron optical system 10 irradiates a specimen S with an electron beam EB. The electron optical system 10 includes an electron gun 12, a condenser lens 14, a deflector 16, and an objective lens 18.

The electron gun 12 emits the electron beam EB. The electron gun 12 emits the electron beam EB accelerated with a predetermined acceleration voltage to the specimen S.

The condenser lens 14 condenses the electron beam EB emitted from the electron gun 12. The deflector 16 deflects the electron beam EB two-dimensionally. By the deflector 16, an electron probe is allowed to scan the specimen S (beam scanning). The objective lens 18 condenses the electron beam EB on the specimen S. By condensing the electron beam EB with the condenser lens 14 and the objective lens 18, formation of an electron probe is allowed.

The specimen stage 20 supports the specimen S. The specimen S is placed on the specimen stage 20. Although not shown in the figures, the specimen stage 20 includes a movement mechanism used to move the specimen S. By moving the specimen S through the specimen stage 20, scanning of the specimen S with an electron probe is allowed (stage scanning).

The electron detector 30 is a detector used to detect electrons emitted from the specimen S. By detecting the electrons emitted from the specimen S with the electron detector 30 while scanning the specimen S with the electron beam EB, acquisition of a scanning electron microscope image (SEM image) is allowed. The electron detector 30 may also be a backscattered-electron detector that detects backscattered electrons or a secondary-electron detector that detects secondary electrons.

The EDS 40 detects characteristic X-ray emitted from the specimen S with a semiconductor detector to analyze energy. By detecting the characteristic X-ray with the EDS 40, acquisition of an X-ray spectrum is allowed.

The analyzer 100 has the five WDS (the WDS 50a, the WDS 50b, the WDS 50c, the WDS 50d, and the WDS 50e) mounted therein. Note that the number of the WDS mounted in the analyzer 100 is not particularly limited.

The WDS 50a includes an analyzing element 52 and an X-ray detector 54. In the WDS 50a, a characteristic X-ray generated from the specimen S is analyzed by the analyzing element 52, and the analyzed X-ray is detected by the X-ray detector 54.

The analyzing element 52 is, for example, an analyzing crystal used to perform an analysis using an X-ray diffraction phenomenon. The WDS 50a includes a plurality of the analyzing elements 52 having different intervals between their crystal surfaces. That is, each of the plurality of analyzing elements 52 has a different analyzing wavelength range. Examples of the analyzing elements 52 include pentaerythritol (PET), lithium fluoride (LiF), thallium acid phthalate (TAP), and stearate (STE). The X-ray detector 54 detects a characteristic X-ray analyzed by the analyzing elements 52.

The WDS 50a includes a driving unit used to move the analyzing elements 52 and the X-ray detector 54. The driving unit moves the analyzing elements 52 and the X-ray detector 54 by, for example, driving of a motor. Thus, arrangement of the analyzing elements 52 and the X-ray detector 54 at desired positions is allowed. In the WDS 50a, detection of an X-ray of energy corresponding to the positions of the analyzing elements 52 is allowed.

As illustrated in FIG. 2, the analyzer 100 has the WDS 50a, the WDS 50b, the WDS 50c, the WDS 50d, and the WDS 50e mounted therein. The WDS 50b, the WDS 50c, the WDS 50d, and the WDS 50e have the same configuration as that of the WDS 50a. Each of the five WDS has a plurality of the analyzing elements 52. With the five WDS mounted therein, the analyzer 100 is allowed to perform a mapping analysis (surface analysis) of five elements at the same time.

The operation unit 70 performs processing for acquiring an operation signal corresponding to an operation by a user and transmitting the acquired operation signal to the control unit 60. The operation unit 70 is, for example, a button, a key, a touch panel display, a microphone, or the like.

The display unit 72 displays an image generated by the control unit 60. The display unit 72 is, for example, a display such as a liquid crystal display (LCD).

The storage unit 74 stores a program or data to be used by the control unit 60 to perform various calculation processing or control processing. Further, the storage unit 74 is also used as a work area for the control unit 60. The storage unit 74 is, for example, a random access memory (RAM), a read only memory (ROM), a hard disk, or the like.

The function of the control unit 60 is realizable when various processors (such as a central processing unit (CPU)) run a program stored in the storage unit 74.

The control unit 60 controls each unit constituting the analyzer 100. For example, the control unit 60 controls the electron optical system 10 and the WDS 50a, 50b, 50c, 50d, and 50e. The control unit 60 performs processing for controlling the electron optical system 10 and the WDS 50a, 50b, 50c, 50d, and 50e to execute spectrum imaging. The details of the processing of the control unit 60 will be described later.

1.2. Analyzing Method 1.2.1. Point Analysis (Qualitative Analysis)

Figure 3:
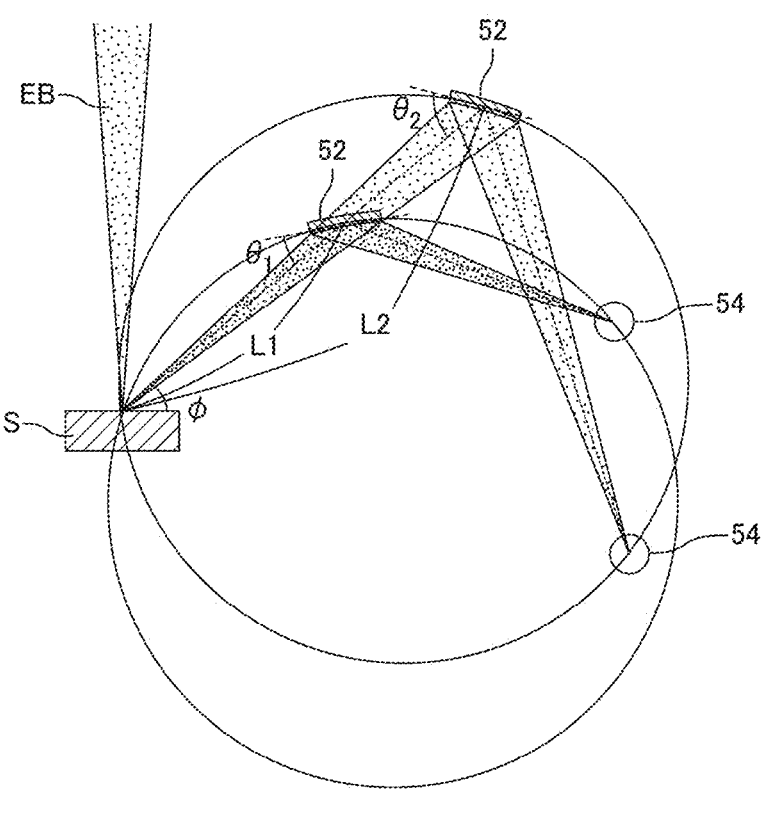
FIG. 3 is a diagram for describing a method for acquiring a spectrum in a WDS.

FIG. 3 is a diagram for describing a method for acquiring a spectrum in a WDS.

In the WDS, an analysis point (irradiation position of an electron beam) on a specimen S, an analyzing element 52, and the X-ray detector 54 are arranged on a Rowland circle so as to obtain a condensing condition satisfying the Bragg's law. The analyzing element 52 moves on a straight line inclined by a take-off angle $\phi$ from the analysis point. Further, the X-ray detector 54 also moves with the movement of the analyzing element 52. A distance from an analysis point to the analyzing element 52 is equal to a distance from the analyzing element 52 to the X-ray detector 54.

Here, when a position (analyzing position L) of the analyzing element 52 is changed with a position (position of an analysis point) of the specimen S fixed, an incident angle $\theta$ of an X-ray relative to the analyzing element 52 changes. The analyzing position L is expressed by a distance from the specimen S (analysis point) to the analyzing element 52.

In an example illustrated in FIG. 3, the analyzing element 52 is moved from an analyzing position $L_1$ at which a distance from the specimen S to the analyzing element 52 is L1 to an analyzing position $L_2$ at which the distance from the specimen S to the analyzing element 52 is $L_2$ ($L_1 < L_2$). Thus, the incident angle θ changes from θ1 to θ2 (θ1<θ2). According to the Bragg's law, the energy (wavelength) of the X-ray detected by the X-ray detector 54 changes with a change in the incident angle θ. Accordingly, when the analyzing position L is changed with the position of the specimen S fixed, acquisition of an X-ray spectrum (hereinafter simply called a "spectrum") of which the energy (wavelength, analyzing position L) is expressed in a horizontal axis and the X-ray intensity is expressed in the vertical axis is allowed.

With a spectrum thus acquired, a qualitative analysis is allowed.

1.2.2. Mapping Analysis (Surface Analysis)

Figure 4:
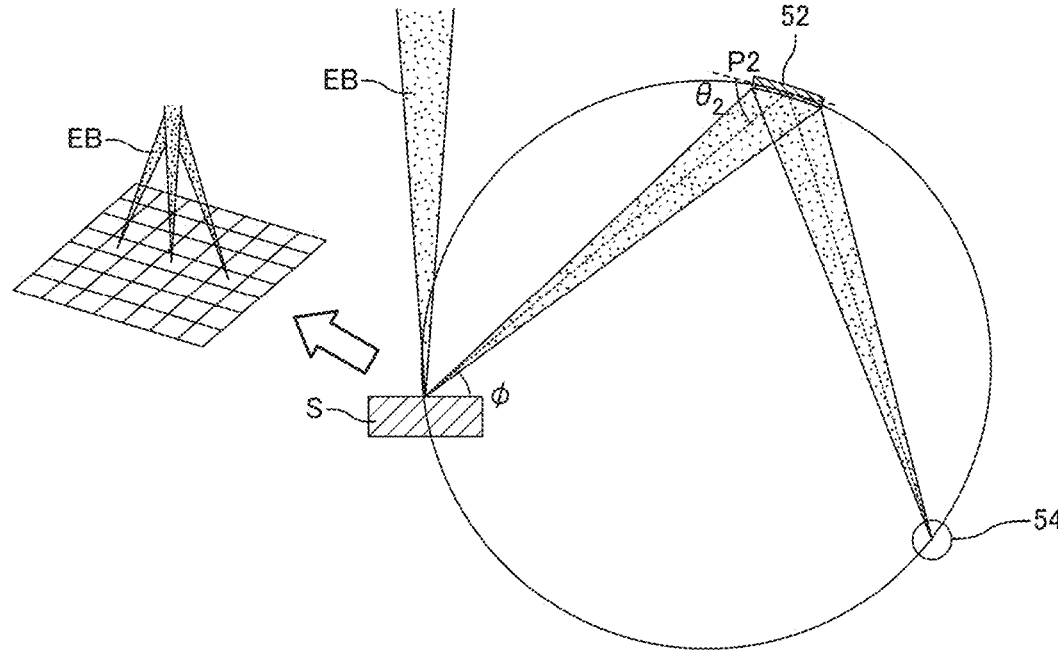
FIG. 4 is a diagram for describing a mapping analysis in a WDS.

FIG. 4 is a diagram for describing a mapping analysis in a WDS.

When map data expressing an intensity distribution about a characteristic X-ray of a specific element, that is, specific energy is acquired, the specimen S is scanned with the electron beam EB with the analyzing position L fixed. At this time, the analyzing element 52 is fixed at the analyzing position L corresponding to the energy of a characteristic X-ray to be analyzed. By scanning the specimen S with an electron probe with the analyzing position L fixed as described above, acquisition of information on X-ray intensity is allowed at each analysis point on the specimen S. Note that the scanning of the specimen S with the electron beam EB may also be performed by beam scanning or stage scanning.

By a mapping analysis, acquisition of map data in which positions on the specimen S and the X-ray intensity of specific energy area associated with each other is allowed. In the map data, the coordinates (position) of each pixel correspond to a position on the specimen S. Information on X-ray intensity acquired at each analysis point is stored in each pixel.

From the map data acquired as a result of the mapping analysis, the acquisition of information on an element distribution is allowed.

1.2.3. Spectrum Imaging

Figure 5:
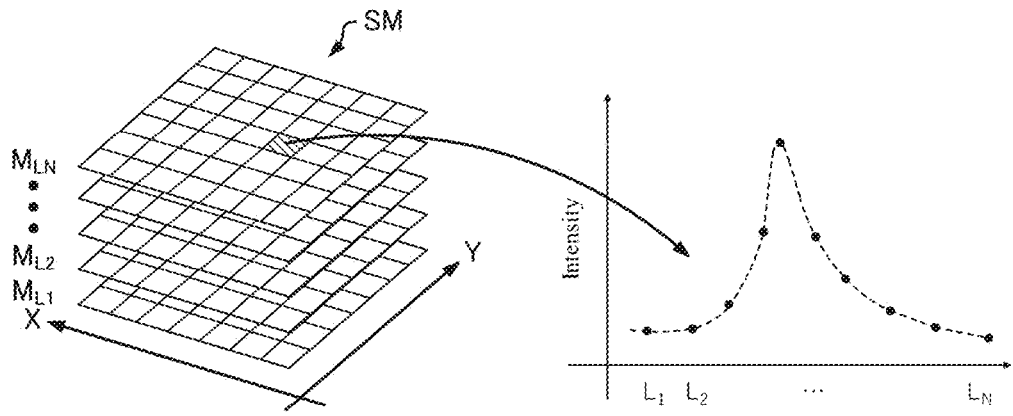
FIG. 5 is a diagram for describing spectrum imaging.

FIG. 5 is a diagram for describing spectrum imaging.

The spectrum imaging is a method for acquiring a spectrum map SM. The spectrum map SM is a map in which positions on the specimen S and spectra are associated with each other.

In the analyzing method according to the first embodiment, a mapping analysis to acquire map data with the analyzing position L fixed is repeatedly performed while changing the analyzing position L to acquire a plurality of map data, and a spectrum map SM is generated based on the plurality of acquired map data.

Figure 6:
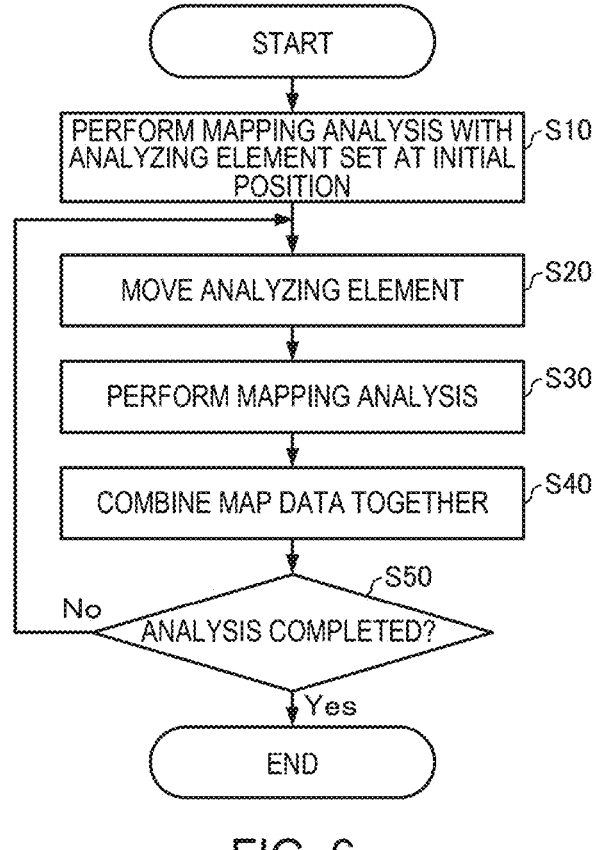
FIG. 6 is a flowchart illustrating an example of the analyzing method according to the first embodiment.

FIG. 6 is a flowchart illustrating an example of the analyzing method according to the first embodiment.

First, a mapping analysis is performed with respect to the specimen S at the analyzing position $L_1$ to acquire map data $M_{L1}$ (S10).

Specifically, the mapping analysis is performed with respect to the specimen S with the analyzing position L fixed at the analyzing position $L_1$. Thus, acquisition of the map data $M_{L1}$ is allowed. In the map data $M_{L1}$, the coordinates of each pixel are expressed by XY coordinates. Further, in each pixel of the map data $M_{L1}$, information on X-ray intensity acquired at an analysis point corresponding to the coordinates of each pixel is stored. In each pixel of the map data $M_{L1}$, information on the X-ray intensity of energy corresponding to the analyzing position $L_1$ is stored.

Next, the analyzing element 52 is moved by a predetermined distance (S20). Thus, the analyzing position L is changed from the analyzing position $L_1$ to the analyzing position $L_2$. An interval at which a position of the analyzing element 52 is changed is, for example, constant. That is, an interval from the analyzing position $L_1$ to the analyzing position $L_2$ is equal to an interval from the analyzing position $L_2$ to an analyzing position $L_3$. It is possible to appropriately change the interval at which the position of the analyzing element 52 is changed.

Next, a mapping analysis is performed with respect to the specimen S at the analyzing position $L_2$ to acquire map data $M_{L2}$ (S30).

Specifically, the mapping analysis is performed with respect to the specimen S with the analyzing position L fixed at the analyzing position $L_2$. Thus, acquisition of the map data $M_{L2}$ is allowed. In each pixel of the map data $M_{L2}$, information on the X-ray intensity of energy corresponding to the analyzing position $L_2$ is stored.

Next, the map data $M_{L1}$ and the map data $M_{L2}$ are combined together (S40).

Information on X-ray intensity is extracted from each corresponding pixel of the map data $M_{L1}$ and the map data $M_{L2}$ to generate one map data. Thus, generation of a spectrum map is allowed. Here, in each pixel of the spectrum map, spectrum data including the information on the X-ray intensity at the analyzing position $L_1$ and the information on the X-ray intensity at the analyzing position $L_2$ is stored.

By repeatedly performing the processing of step S20 to move the analyzing element 52, the processing of step S30 to perform a mapping analysis, and the processing of step S40 to combine map data together, map data $M_{L3}$, map data $M_{L4}$, . . . , map data $M_{LN}$ are acquired. When N map data is acquired (Yes in S50), the spectrum imaging ends.

In each pixel constituting the spectrum map SM, spectrum data including information on X-ray intensity at N different analyzing positions L (the analyzing position $L_1$, the analyzing position $L_2$, . . . , an analyzing position L N) is stored as illustrated in FIG. 5. In an example of a spectrum illustrated in FIG. 5, the analyzing position L is expressed in a horizontal axis but the energy (wavelength) of an X-ray may be expressed in the horizontal axis.

With the five WDS mounted therein, the analyzer 100 is allowed to acquire five spectrum maps SM at the same time.

The spectrum map SM includes not only a peak position but also its preceding and subsequent data. Therefore, various analyses are capable of being performed after acquisition of the spectrum map SM. For example, the spectrum map SM includes background data. Therefore, acquisition of information in which the intensity of a background is subtracted from the peak intensity is allowed. Further, specification of specific energy (element) is not needed but specification of a measurement energy range is only needed in the spectrum map SM. Therefore, it is possible to perform an analysis even when the specimen S contains an unknown element.

Further, in the spectrum map SM, corrections of a shift of a spectrum resulting from displacement of the height of the specimen S, a shift of a spectrum resulting from deflection of the electron beam EB, and a reduction in X-ray intensity due to the deflection of the electron beam EB are allowed. These corrections will be described later.

1.3. Processing of Control Unit

Figure 7:
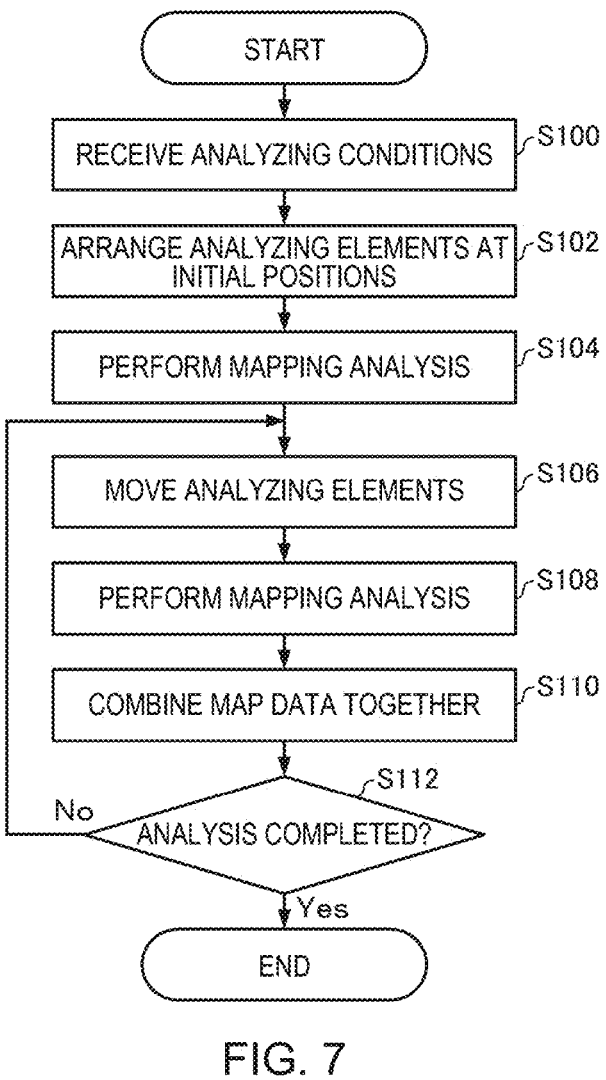
FIG. 7 is a flowchart illustrating an example of spectrum imaging processing of a control unit.

FIG. 7 is a flowchart illustrating an example of the spectrum imaging processing of the control unit 60.

The control unit 60 receives settings of analyzing conditions for spectrum imaging (S100).

A user sets a region for performing spectrum imaging of the specimen S, the condition of the electron optical system 10, and the condition of each WDS. The condition of the WDS includes the type of the analyzing element 52, a measurement energy range, and a measurement energy interval.

For example, the user moves his/her visual field to the region for performing the spectrum imaging of the specimen S. Further, the user sets an accelerating voltage or an illumination current amount as the condition of the electron optical system 10. Further, the user selects the type of the analyzing element 52, and sets a measurement energy range and a measurement energy interval in each of the five WDS. The settings of these conditions are performed by the user through operation of the operation unit 70. The control unit 60 receives the settings of the analyzing conditions via the operation unit 70. After the settings of these conditions, the user inputs instructions to start an analysis via the operation unit 70.

The control unit 60 arranges the analyzing element 52 at an initial position in each of the five WDS (S102).

The control unit 60 moves the analyzing element 52 of the WDS 50a and sets the analyzing position L as an initial position according to the measurement energy range set in the WDS 50a. Similarly, the control unit 60 moves the analyzing element 52 of the WDS 50b and sets an analyzing position L as an initial position according to the measurement energy range set in the WDS 50b. For each of the WDS 50c, the WDS 50d, and the WDS 50e as well, the control unit 60 similarly sets the analyzing position L as an initial position.

Next, the control unit 60 performs a mapping analysis (S104).

For example, the control unit 60 causes the WDS 50a to detect an X-ray of specific energy with the position of the analyzing element 52 fixed, while causing the electron optical system 10 to deflect the electron beam EB and scan the specimen S with the electron beam EB. Thus, acquisition of the map data of the energy corresponding to the analyzing position L is allowed. The control unit 60 similarly causes the WDS 50b to detect an X-ray of specific energy with the position of the analyzing element 52 fixed. For each of the WDS 50c, the WDS 50d, and the WDS 50e as well, the control unit 60 similarly causes the WDS 50c, the WDS 50d, and the WDS 50e to detect an X-ray of specific energy with the position of the analyzing element 52 fixed.

With the five WDS mounted therein, the analyzer 100 is allowed to acquire five map data each having different energy at the same time. The five acquired map data is stored in the storage unit 74. Note that the electron optical system 10 is caused to deflect the electron beam EB to scan the specimen S with the electron beam EB here (beam scanning), but the specimen stage 20 may be caused to move the specimen S to scan the specimen S with the electron beam EB (beam scanning).

Next, the control unit 60 moves the analyzing elements 52 based on the set measurement energy intervals (S106).

The control unit 60 moves the analyzing element 52 of the WDS 50a by a distance corresponding to the measurement energy interval set in the WDS 50a. Thus, the analyzing position L is changed by the distance corresponding to the measurement energy interval from the initial position. Similarly, the control unit 60 moves the analyzing element 52 of the WDS 50b by a distance corresponding to the measurement energy interval set in the WDS 50b. For each of the WDS 50c, the WDS 50d, and the WDS 50e as well, the control unit 60 similarly moves the analyzing element 52 by a distance corresponding to the measurement energy interval.

Next, the control unit 60 performs a mapping analysis (S108).

The mapping analysis is performed in the same way as the processing of step S104 described above. Thus, acquisition of the map data of energy corresponding to the analyzing positions L moved by the set measurement energy intervals from the initial positions is allowed. The five acquired map data is stored in the storage unit 74.

Next, the control unit 60 combines the map data together (S110).

The control unit 60 combines the map data stored in the storage unit 74 together. The map data is combined together for each of the WDS. Thus, generation of five spectrum maps is allowed. Here, the mapping analysis was performed twice. Therefore, spectrum data including information on X-ray intensity acquired at two analysis points is stored in each pixel of the spectrum maps.

Next, the control unit 60 determines whether the spectrum imaging is completed (S112).

The control unit 60 determines that the spectrum imaging is completed when the mapping analysis has ended in the set measurement energy ranges end in all the five WDS. Note that when the mapping analysis has ended in the set measurement energy range in WDS 50a but has not ended in the measurement energy ranges in the other WDS, the control unit 60 stops the processing with respect to the WDS 50a and continues the processing with respect to the other WDS. When the mapping analysis has ended in the set measurement energy ranges in all the five WDS as described above, the control unit 60 determines that the spectrum imaging is completed.

When determining that the spectrum imaging is not completed (No in S112), the control unit 60 returns to the processing of S106 to perform the processing of S106 to move the analyzing elements 52, the processing of S108 to perform a mapping analysis, and the processing of S110 to combine map data together.

Until determining that the spectrum imaging is completed, the control unit 60 repeatedly performs the processing of S106 to move the analyzing elements 52, the processing of S108 to perform a mapping analysis, and the processing of S110 to combine map data together.

When determining that the spectrum imaging is completed (Yes in S112), the control unit 60 ends the spectrum imaging processing. By the above processing, acquisition of the five spectrum maps is allowed.

1.4. Correction Method 1.4.1. Correction of Spectrum Shift Resulting from Displacement of Height of Specimen In a mapping analysis, there is a case that a condensing condition is not satisfied since an analysis point on the specimen S is displaced from a Rowland circle due to irregularities or a slant on the surface of the specimen. When the condensing condition is not satisfied, a spectrum shifts.

Therefore, in the analyzing method according to the first embodiment, a spectrum shift resulting from displacement of the specimen S from a Rowland circle in a height direction (Z-direction) (hereinafter also simply called "displacement of the height of a specimen") is corrected in a spectrum map. In other words, the displacement of the height of the specimen is displacement of the height of the specimen with respect to a height satisfying the condensing condition. The height direction of the specimen S is a direction along a Z-axis. The Z-axis is an axis parallel to the optical axis of the electron optical system 10.

The correction of the spectrum shift resulting from the displacement of the height of the specimen is performed based on information showing the relationship between a displacement amount of the height of the specimen and a spectrum shift amount.

<Method for Finding Relationship Between Displacement Amount of Height of Specimen and Spectrum Shift Amount>

The analyzing method according to the first embodiment includes the step of acquiring information showing the relationship between a displacement amount of the height of a specimen and a spectrum shift amount. In the step of acquiring the information, an X-ray emitted from a standard specimen when the standard specimen is irradiated with the electron beam EB in a state in which the height of the specimen is not displaced is first detected while a changing position of the analyzing element 52 to acquire a reference spectrum. Next, an analysis to detect an X-ray emitted from the standard specimen when the standard specimen is irradiated with the electron beam EB in a state in which the height of the specimen is displaced while changing the position of the analyzing element 52 to acquire a comparison spectrum is repeatedly performed while changing a displacement amount of the height of the specimen to acquire a plurality of comparison spectra. Next, the reference spectrum is compared with each of the comparison spectra to acquire information showing the relationship between the displacement amount of the height of the specimen and a spectrum shift amount.

Figure 8:
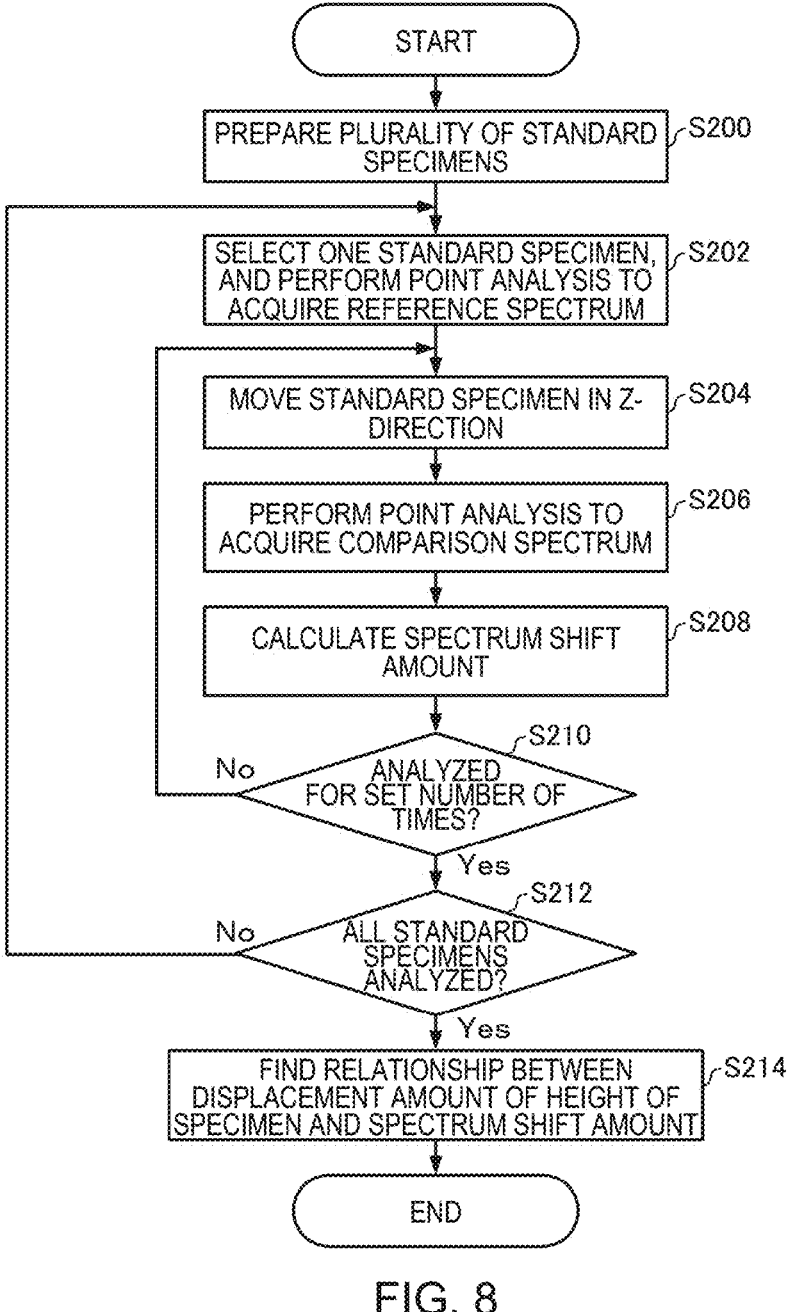
FIG. 8 is a flowchart illustrating an example of a method for finding a relationship between a displacement amount of a height of a specimen and a spectrum shift amount.

FIG. 8 is a flowchart illustrating an example of a method for finding the relationship between a displacement amount of the height of a specimen and a spectrum shift amount. Hereinafter, a case in which a PET crystal is used as the analyzing element 52 will be described.

First, a plurality of standard specimens are prepared (S200).

The standard specimens are, for example, specimens made of a targeted single element. When a PET crystal is used as the analyzing elements 52, a standard specimen made of Ti, a standard specimen made of Cd, a standard specimen made of Mo, and a standard specimen made of Si are available as the standard specimens. Any of the standard specimens is appropriately selected according to the type of the analyzing element 52. The standard specimen is selected from among standard specimens containing an element measurable by the selected analyzing element 52.

Next, a point analysis is performed with respect to the standard specimen to acquire a reference spectrum (S202).

First, one of the plurality of standard specimens is selected. Here, the standard specimen made of Ti is selected. Note that the order of selecting a standard specimen is not particularly limited but the standard specimen may be selected in the order of atomic numbers. The selected standard specimen made of Ti is arranged on the specimen stage 20, and the position (height) of the standard specimen in a Z-direction is adjusted using the specimen stage so as to focus on the standard specimen. Arrangement of the standard specimen on a Rowland circle is allowed by arranging, for example, the standard specimen at a position at which the standard specimen is focused on. At this time, an analysis point on the specimen S is at the center of an observation visual field. That is, the electron beam EB is not deflected by the deflector 16 but is irradiated onto the standard specimen along the optical axis of the electron optical system 10. In this state, the point analysis is performed to acquire the reference spectrum of Ti. The reference spectrum is a spectrum acquired in a state in which a condensing condition is satisfied. That is, the reference spectrum is a spectrum acquired in a state in which the height of the specimen is not displaced.

Next, the standard specimen is moved by a predetermined amount in the Z-direction (S204). Thus, the height of the standard specimen is displaced. In this state, a point analysis is performed to acquire the comparison spectrum of Ti (S206). The comparison spectrum is a spectrum acquired in a state in which the height of the specimen is displaced.

Next, the reference spectrum is compared with the comparison spectrum to calculate a spectrum shift amount (S208). Specifically, a shift amount of the peak position of Ti in the comparison spectrum with respect to the peak position of Ti in the reference spectrum is calculated. Thus, calculation of the spectrum shift amount in a case in which the height of the specimen is displaced by the predetermined amount is allowed.

Next, determination is made as to whether a point analysis has been performed for a previously-set number of times (S210). The number of repeating times is appropriately changeable according to requested correction accuracy.

When the point analysis has not been performed for the previously-set number of times (No in S210), the processing returns to step S204 to move the standard specimen in the Z-direction (S204), acquire the comparison spectrum of Ti (S206), and calculate a spectrum shift amount (S208).

As described above, the processing of step S204 to move the standard specimen in the Z-direction, the processing of step S206 to perform a point analysis, and the processing of step S208 to calculate a spectrum shift amount are repeatedly performed until the point analysis is performed for the previously-set number of times. Thus, acquisition of a table of the displacement amount of the height of the specimen and the spectrum shift amount is allowed for the spectrum of Ti.

When the point analysis has been performed for the set number of times (Yes in S210), determination is made as to whether all the standard specimens have been analyzed (S212).

When all the standard specimens have not been analyzed (No in S212), the processing returns to step S202 to select the standard specimen made of Cd, perform the processing of steps S202, S204, S206, S208, and S210 and acquire a table of a displacement amount of the height of the specimen and the spectrum shift amount for the spectrum of Cd.

The processing of steps S202, S204, S206, S208, and S210 is repeatedly performed as described above to analyze the standard specimen made of Ti, the standard specimen made of Cd, the standard specimen made of Mo, and the standard specimen made of Si. As a result, acquisition of a table of the displacement amount of the height of the specimen and the spectrum shift amount is allowed for each of the spectrum of Ti, the spectrum of Cd, the spectrum of Mo, and the spectrum of Si.

When all the standard specimens have been analyzed (Yes in S212), the relationship between the displacement amount of the height of the specimen and the spectrum shift amount is found (S214).

Figures 9, 10:
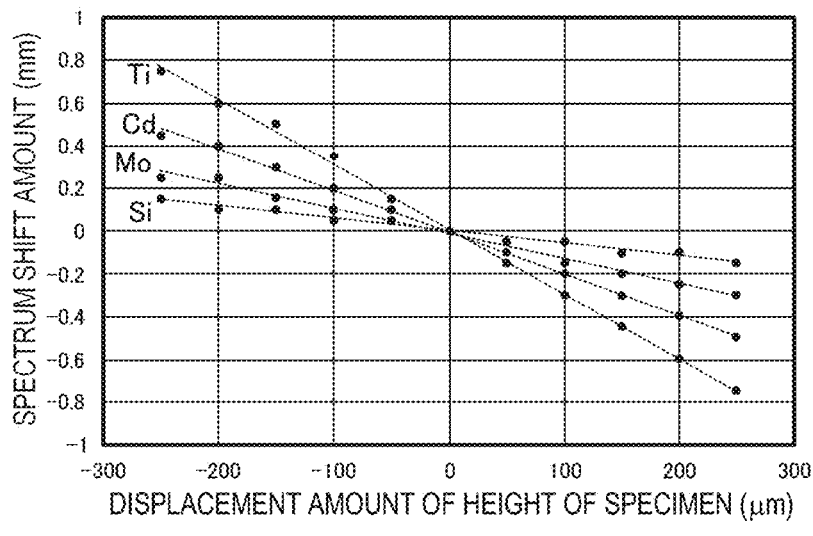
FIG. 9 is a graph illustrating the relationship between a displacement amount of a height of a specimen and a spectrum shift amount.
FIG. 10 is a graph illustrating a relationship between an analyzing position and s spectrum shift amount.

FIG. 9 is a graph illustrating the relationship between the displacement amount of the height of the specimen and the spectrum shift amount for each of the spectrum of Ti, the spectrum of Cd, the spectrum of Mo, and the spectrum of Si. In FIG. 9, a horizontal axis shows the displacement amount of the height of the specimen, and a vertical axis shows the spectrum shift amount. Note that the spectrum shift amount expresses the difference between the peak position of the reference spectrum and the peak position of the comparison spectrum as a difference (mm) in the analyzing position L.

From the table of the displacement amount of the height of the specimen and the spectrum shift amount for each of the spectrum of Ti, the spectrum of Cd, the spectrum of Mo, and the spectrum of Si, the graph illustrated in FIG. 9 is generated. As illustrated in FIG. 9, the relationship between the displacement amount of the height of the specimen and the spectrum shift amount is found for each element, that is, for each energy (analyzing position L).

By the above step, finding of the relationship between the displacement amount of the height of the specimen and the spectrum shift amount is allowed.

FIG. 10 is a graph illustrating the relationship between the analyzing position L (energy of a characteristic X-ray) and the spectrum shift amount for each displacement amount of the height of the specimen.

The graph illustrated in FIG. 10 is obtained from the graph illustrated in FIG. 9. Specifically, an item (element) of the graph illustrated in FIG. 9 is converted into the horizontal axis of the graph illustrated in FIG. 10. At this time, the item (element) of the graph illustrated in FIG. 9 is expressed as the analyzing position L in the horizontal axis of the graph illustrated in FIG. 10. Moreover, the displacement amount of the height of the specimen illustrated in FIG. 9 is converted into an item of the graph illustrated in FIG. 10.

Thus, from the relationship between the displacement amount of the height of the specimen and the spectrum shift amount found for each element illustrated in FIG. 9, finding of the relational expression between the analyzing position L and the spectrum shift amount is allowed for each displacement amount of the height of the specimen illustrated in FIG. 10.

Information showing the relationship between the displacement amount of the height of the specimen and the spectrum shift amount for each element illustrated in FIG. 9 and information showing the relationship between the analyzing position L and the spectrum shift amount for each displacement amount of the height of the specimen illustrated in FIG. 10 are stored in the storage unit 74. The relationship illustrated in FIG. 9 and the relationship illustrated in FIG. 10 are different from each other in their expressing ways, one of the information on the relationship illustrated in FIG. 9 and the information on the relationship illustrated in FIG. 10 is only required to be stored in the storage unit 74.

<Method for Correcting Spectrum Shift Resulting from Displacement of Height of Specimen>

Next, a method for correcting a spectrum shift resulting from displacement of the height of a specimen will be described. Hereinafter, a case in which a shift of an Sc-Kα line resulting from the displacement of the height of the specimen is corrected will be described as an example of correcting the spectrum shift resulting from displacement of the height of the specimen.

First, from the relational expression illustrated in FIG. 10, the relationship between a displacement amount of the height of the specimen and a spectrum shift amount in the Sc-Kα line is found.

Figure 11:
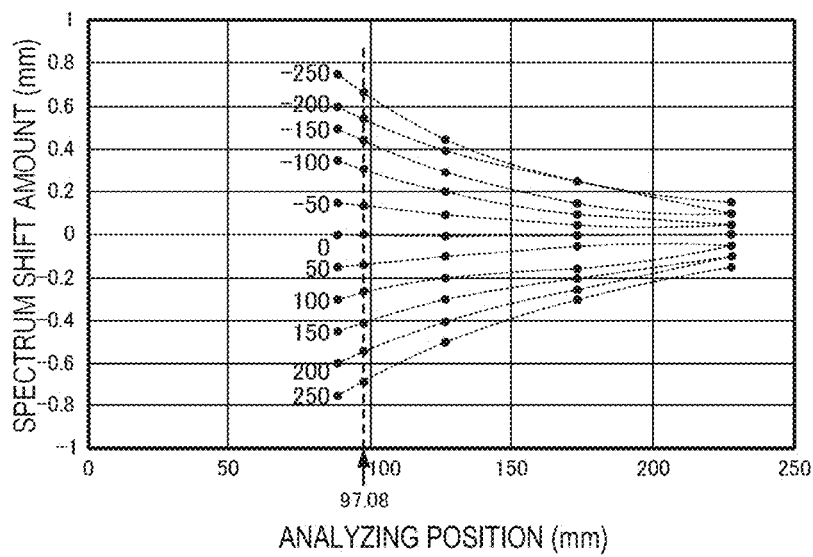
FIG. 11 is a graph for describing a method for finding a relationship between a displacement amount of a height of a specimen and a spectrum shift amount in an Sc-Kα line.

FIG. 11 is a graph for describing a method for finding the relationship between the displacement amount of the height of the specimen and the spectrum shift amount in the Sc-Kα line from the relational expression illustrated in FIG. 10.

As illustrated in FIG. 11, a straight line is drawn at the analyzing position L=97.08 mm showing the peak position of the Sc-Kα line, and an intersecting point between the straight line and the relational expression between the analyzing position L and the spectrum shift amount drawn for each displacement amount of the height of the specimen is found. The found intersecting points are plotted in a graph in which a horizontal axis shows the displacement amount of the height of the specimen and a vertical axis shows the spectrum shift amount. Thus, finding of the relational expression between the displacement amount of the height of the specimen and the spectrum shift amount in the Sc-Kα line is allowed.

Figure 12:
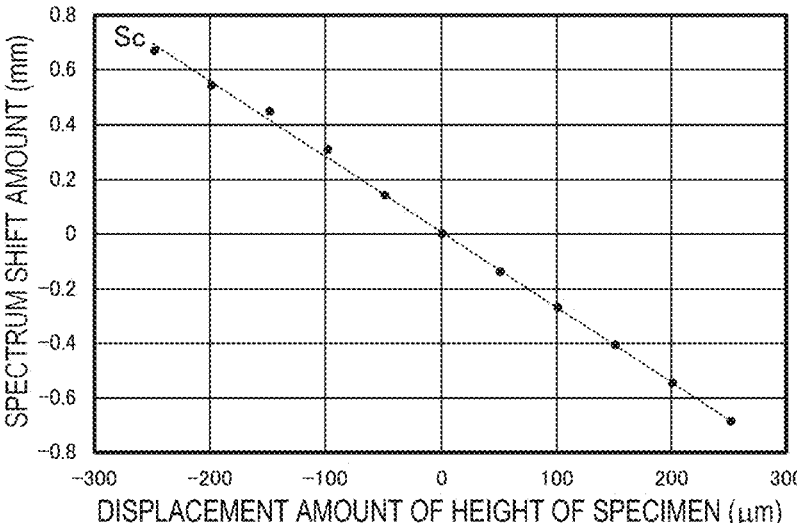
FIG. 12 is a graph illustrating a relational expression between a displacement amount of a height of a specimen and a spectrum shift amount in an Sc-Kα line.

FIG. 12 is a graph illustrating the relational expression between the displacement amount of the height of the specimen and the spectrum shift amount in the Sc-Kα line.

Next, a peak spectrum shift of Sc of a spectrum stored in each pixel of a spectrum map is corrected using the relational expression illustrated in FIG. 12. Specifically, the spectrum shift amount is first calculated from the height of the specimen in each pixel using the relational expression illustrated in FIG. 12. As information on the height of the specimen in each pixel, a measurement result of the height of the specimen measured in advance by a laser microscope is, for example, available.

Next, the peak of Sc of an X-ray spectrum is shifted based on the calculated spectrum shift amount in each pixel.

By the above step, correction of the spectrum shift resulting from the displacement of the height of the specimen is allowed.

Note that one peak is a correction target in the above but a plurality of peaks may be correction targets. When a plurality of peaks are correction targets, the correction described above is only required to be made to each of the plurality of peaks that are the correction targets.

<Correction Processing of Spectrum Shift Resulting from Displacement of Height of Specimen>

Figure 13:
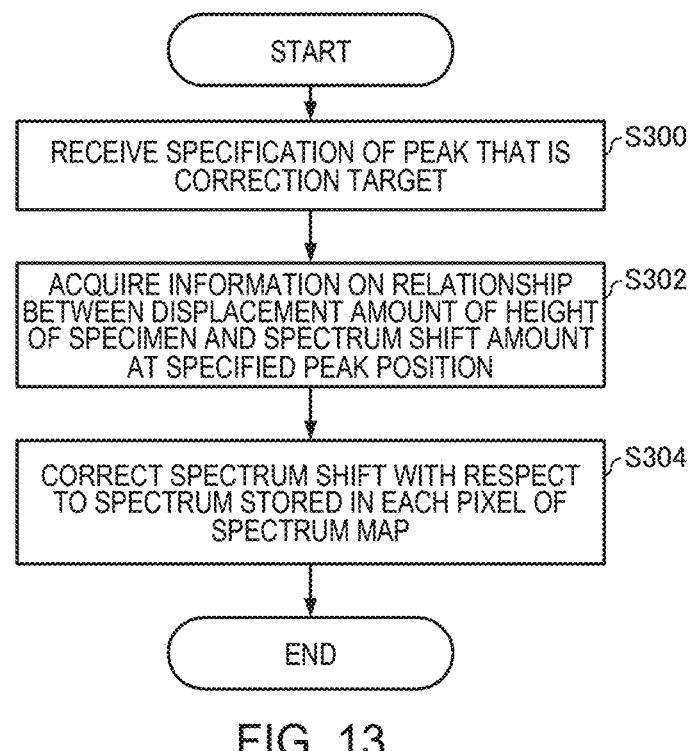
FIG. 13 is a flowchart illustrating an example of correction processing of a spectrum shift resulting from displacement of a height of a specimen in a control unit.

FIG. 13 is a flowchart illustrating an example of correction processing of a spectrum shift resulting from displacement of the height of a specimen in the control unit 60.

The control unit 60 receives specification of a peak that is a correction target (S300).

The peak may be expressed as the analyzing position L or the energy (wavelength) of an X-ray. The control unit 60 reads the relational expression stored in advance in the storage unit 74 and illustrated in FIG. 9, and finds information showing the relationship between a displacement amount of the height of the specimen and a spectrum shift amount at the peak position specified based on the relational expression (S302). Thus, acquisition of the information showing the relationship between the displacement amount of the height of the specimen and the spectrum shift amount at the specified peak position is allowed.

Next, the control unit 60 corrects a spectrum shift with respect to a spectrum stored in each pixel of a spectrum map based on the information showing the relationship between the displacement amount of the height of the specimen and the spectrum shift amount (S304).

By the above processing, correction of the spectrum shift resulting from the displacement of the height of the specimen is allowed.

Experimental Example

A point analysis was performed while changing the height of a specimen to acquire a plurality of spectra of Sc.

Figure 14:
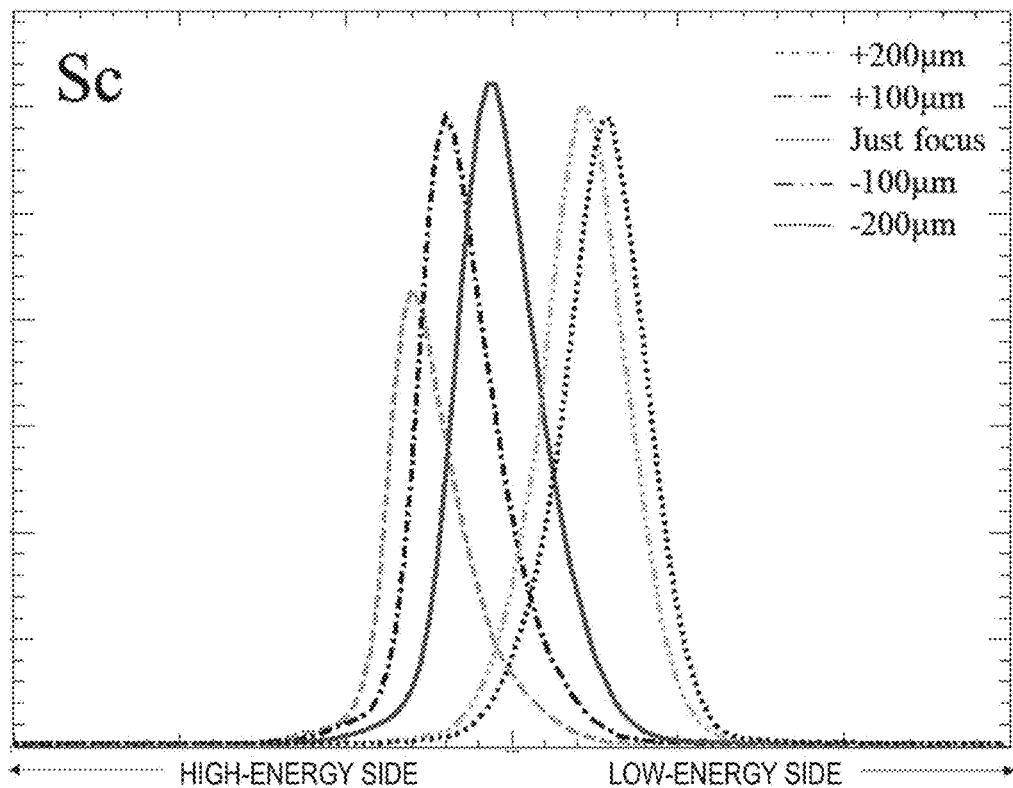
FIG. 14 is a graph illustrating a plurality of spectra acquired by performing a point analysis while changing a height of a specimen with respect to a specimen containing Sc.

FIG. 14 is a graph illustrating a plurality of spectra of Sc acquired by performing a point analysis while changing the height of a specimen with respect to the specimen containing Sc. Here, the spectrum of Sc was acquired at each of a position (just focus) at which the specimen was focused on, a position at which the height of the specimen was displaced by +100 μm from the position at which the specimen was focused on, a position at which the height of the specimen was displaced by +200 μm, a position at which the height of the specimen was displaced by –100 μm, and a position at which the height of the specimen was displaced by –200 μm. At the position at which the specimen was focused on, an analysis point on the specimen is positioned on a Rowland circle, and a condensing condition is satisfied. It is apparent from the plurality of spectra of Sc illustrated in FIG. 14 that a spectrum shift amount is large when a displacement amount of the height of the specimen is large.

In the plurality of spectra of Sc illustrated in FIG. 14, the spectrum shifts resulting from the displacement of the height of the specimen were corrected. Specifically, from the heights of the specimen obtained when the respective spectra were acquired, the spectrum shift amounts in the respective spectra were calculated using the relational expression between the displacement amount of the height of the specimen and the spectrum shift amount illustrated in FIG. 12. Then, the spectra were shifted based on the spectrum shift amounts calculated in the respective spectra.

Figure 15:
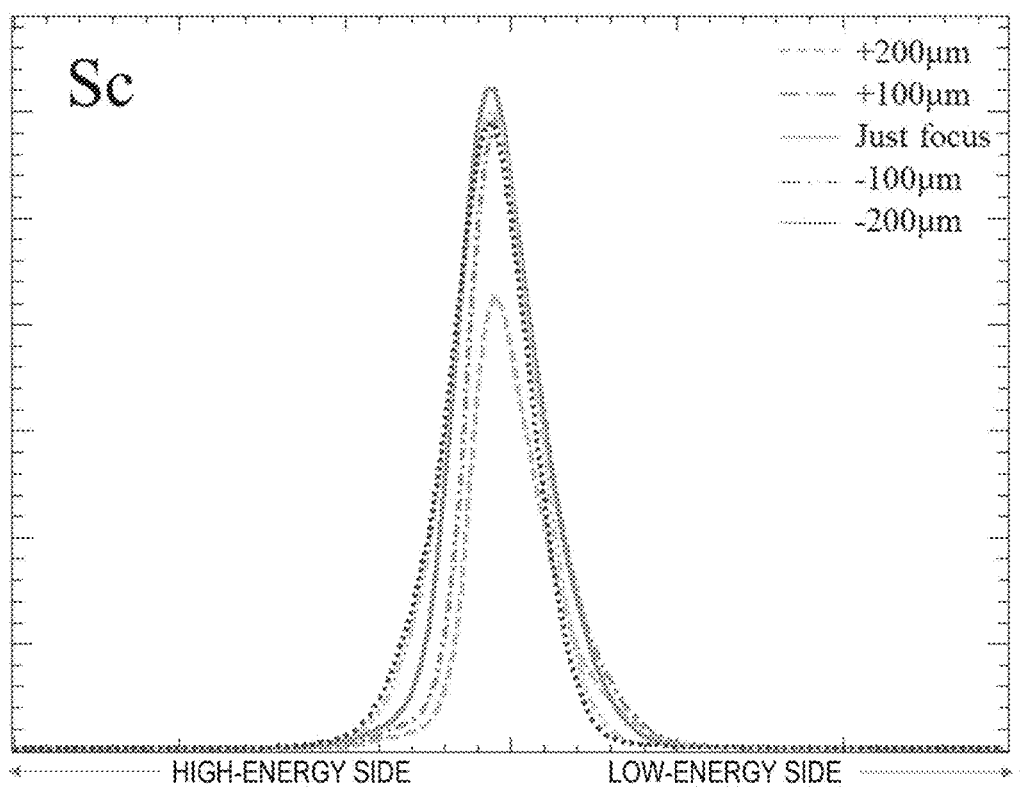
FIG. 15 is a graph illustrating results obtained by correcting spectrum shifts resulting from displacement of a height of a specimen in each spectrum of Sc.

FIG. 15 is a graph illustrating results obtained by correcting the spectrum shifts resulting from displacement of the height of the specimen in the respective spectrums of Sc illustrated in FIG. 14.

As illustrated in FIG. 15, the positions of the peaks of the respective spectra acquired under different displacement amounts of the height of the specimen were coincident with each other as a result of the correction. Accordingly, the spectrum shifts resulting from the displacement of the height of the specimen were accurately corrected.

1.4.2. Z-Map

As illustrated in FIG. 14, the spectrum shift amount changes according to the size of displacement when the height of the specimen is displaced. Therefore, a reference spectrum is compared with a spectrum stored in each pixel of a spectrum map to calculate a spectrum shift amount, whereby calculation of the height of the specimen in each pixel is allowed. Accordingly, a Z-map expressing the distribution of the heights of the specimen is creatable. The Z-map is a map in which positions on the specimen and the heights of the specimen are associated with each other.

As described above, acquisition of information on the shape of a specimen surface from the spectrum map is allowed.

In the analyzer 100, the control unit 60 performs processing for calculating the height of a specimen in each pixel and generating a Z-map by comparing a reference spectrum with a spectrum stored in each pixel of a spectrum map to calculate a spectrum shift amount.

1.5. Effects

The analyzing method according to the first embodiment is an analyzing method using the analyzer 100 in which the WDS 50a that has the analyzing element 52 to analyze an X-ray emitted from the specimen S and that detects an X-ray of energy corresponding to a position of the analyzing element 52 is mounted. Further, the analyzing method according to the first embodiment includes: the step of acquiring a plurality of map data by repeatedly performing a mapping analysis while changing the position of the analyzing element 52, the mapping analysis being an analysis to detect an X-ray of specific energy with a position of the analyzing element 52 fixed to acquire map data while scanning the specimen S with the electron beam EB; the step of generating a spectrum map in which a position on the specimen S and an X-ray spectrum are associated with each other based on the plurality of map data.

Therefore, acquisition of a spectrum map is facilitated using a WDS in the analyzing method according to the first embodiment.

For example, when a point analysis is performed at each analysis point on a specimen to acquire a spectrum and acquire a spectrum map, the analyzing element 52 has to be moved by a distance corresponding to a measurement energy range for each analysis point. That is, the operation of moving the analyzing element 52 by the distance corresponding to the measurement energy range has to be performed by the number of the analysis points. Conversely, the operation of moving the analyzing element 52 by a distance corresponding to a measurement energy range is only required to be performed once in the analyzing method according to the first embodiment.

Here, the movement of the analyzing element 52 is performed by mechanical driving such as driving of a motor, and movement (scanning) of the electron beam EB is performed by electrical driving such as the deflector 16. Accordingly, acquisition of a spectrum map in a short period of time is allowed in the analyzing method of the analyzer 100, compared with a case in which a point analysis is performed with respect to each analysis point to acquire a spectrum map.

In the analyzing method according to the first embodiment, a plurality of WDS are mounted in the analyzer 100, the step of acquiring a plurality of map data and the step of generating a spectrum map are performed for each of the WDS. As described above, acquisition of a spectrum map is allowed at the same time by the number of the WDS mounted in the analyzer 100 in the analyzing method according to the first embodiment.

The analyzing method according to the first embodiment includes the step of correcting a spectrum shift resulting from displacement of the height of a specimen in a spectrum stored in each pixel of a spectrum map. In the step of correcting the spectrum shift, the spectrum shift is corrected based on information showing the relationship between a displacement amount of the height of the specimen and a spectrum shift amount. Therefore, correction of a spectrum shift resulting from displacement of the height of a specimen is facilitated in the analyzing method according to the first embodiment.

The analyzing method according to the first embodiment includes the step of acquiring information showing the relationship between a displacement amount of the height of a specimen and a spectrum shift amount. In the step of acquiring the information, an X-ray emitted from a standard specimen when the standard specimen is irradiated with an electron beam EB in a state in which the height of the specimen is not displaced is first detected while changing a position of the analyzing element 52 to acquire a reference spectrum. Next, an analysis to detect an X-ray emitted from the standard specimen when the specimen is irradiated with the electron beam EB in a state in which the height of the specimen is displaced while changing the position of the analyzing element 52 to acquire a comparison spectrum is repeatedly performed while changing a displacement amount of the height of the specimen to acquire a plurality of comparison spectra. After that, the reference spectrum is compared with each of the comparison spectra to acquire the information.

Therefore, acquisition of information showing the relationship between a displacement amount of the height of a specimen and a spectrum shift amount is allowed in the analyzing method according to the first embodiment.

The analyzing method according to the first embodiment includes: the step of comparing a spectrum stored in each pixel of a spectrum map with a reference spectrum to calculate a spectrum shift amount; and the step of generating a Z-map in which a position on a specimen and the height of the specimen are associated with each other based on the spectrum shift amount. Therefore, acquisition of information on the shape of a specimen surface is allowed from a spectrum map in the analyzing method according to the first embodiment.

The analyzer 100 includes: the electron optical system 10 that irradiates the specimen S with the electron beam EB; the WDS 50a that has the analyzing element 52 to analyze an X-ray emitted from the specimen S and detects an X-ray of energy corresponding to a position of the analyzing element 52; and the control unit 60 that controls the electron optical system 10 and the WDS 50a. Further, the control unit 60 performs processing for: acquiring a plurality of map data by repeatedly performing a mapping analysis, the mapping analysis being an analysis to cause the WDS 50a to detect an X-ray of specific energy with the position of the analyzing element 52 fixed to acquire map data while scanning the specimen S with the electron beam EB, while causing the WDS 50a to change the position of the analyzing element 52; and generating, based on the plurality of map data, a spectrum map in which a position on the specimen S and an X-ray spectrum are associated with each other.

Therefore, the analyzer 100 is allowed to easily acquire a spectrum map using the WDS 50a.

In the analyzer 100, a plurality of WDS are mounted, and processing for acquiring a plurality of map data and processing for generating a spectrum map are performed in each of the WDS. Therefore, the analyzer 100 is allowed to acquire a plurality of spectrum maps at the same time.

The analyzer 100 includes the storage unit 74 in which information showing the relationship between a displacement amount of the height of a specimen S and a spectrum shift amount is stored. Therefore, the analyzer 100 is allowed to correct a spectrum shift resulting from displacement of the height of the specimen S with respect to a spectrum stored in each pixel of a spectrum map.

2. Second Embodiment 2.1. Analyzer

Next, an analyzing method according to the second embodiment will be described. Hereinafter, points of the analyzing method according to the second embodiment that are different from those of the analyzing method according to the first embodiment will be described, and descriptions of the same points will be omitted.

An analyzer used in the analyzing method according to the second embodiment is the same as the above analyzer 100 illustrated in FIGS. 1 and 2, and its description will be omitted.

2.2. Mapping Analysis with Low Magnification

An analyzer 100 is capable of performing a mapping analysis in two ways, i.e., stage scanning in which a specimen stage 20 is moved to scan a specimen S with an irradiation position of an electron beam EB fixed and beam scanning in which the electron beam EB is deflected two-dimensionally to scan the specimen S with the specimen stage 20 fixed.

For example, a mapping analysis is performed using the stage scanning when an observation magnification is a low magnification of less than 3000 times, and performed using the beam scanning when the observation magnification is a magnification of 3000 times or more. This is because when the beam scanning is performed with a low magnification, a condensing condition of the WDS is not satisfied since an analysis point (irradiation position of an electron beam) is displaced from a Rowland circle, which causes a spectrum shift or a reduction in X-ray intensity.

Figure 16:
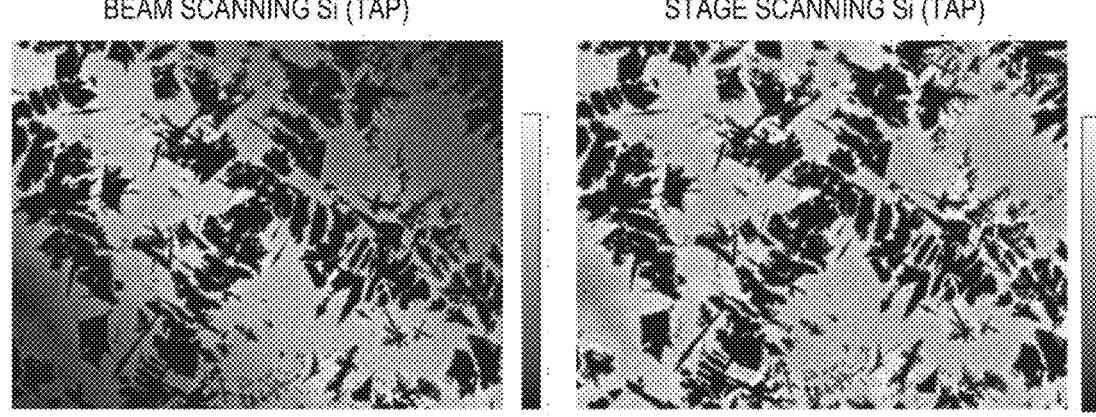
FIG. 16 is a diagram in which a result of performing a mapping analysis with an observation magnification of 500 times using beam scanning and a result of performing a mapping analysis using stage scanning with respect to a visual field corresponding to beam scanning are compared with each other.

FIG. 16 is a diagram in which a result of performing a mapping analysis with an observation magnification of 500 times using the beam scanning and a result of performing a mapping analysis using the stage scanning with respect to a visual field corresponding to the beam scanning are compared with each other. Two maps illustrated in FIG. 16 are maps of Si measured using a TAP crystal as an analyzing element 52. In FIG. 16, a region displayed darker is a region having lower X-ray intensity. As illustrated in FIG. 16, a reduction in X-ray intensity is observed in a region at the end of an observation visual field, that is, a region in which the electron beam EB is largely deflected.

However, the stage scanning requires a longer time for a mapping analysis compared with the beam scanning. Since a multiplicity of mapping analyses are performed in spectrum imaging, it is desired to perform the mapping analyses using the beam scanning even when an observation magnification is a low magnification.

In the analyzing method according to the second embodiment, spectrum imaging is performed in the same method as the above analyzing method according to the first embodiment illustrated in FIG. 6 to acquire a spectrum map. However, an observation magnification is a low magnification, and scanning of the specimen S with the electron beam EB is performed using the beam scanning. In the analyzing method according to the second embodiment, corrections of a spectrum shift and a reduction in X-ray intensity that are caused when a mapping analysis is performed with a low magnification using the beam scanning are performed with respect to a spectrum stored in each pixel of the spectrum map thus acquired.

2.3. Correction Method 2.3.1. Correction of Spectrum Shift Resulting from Deflection of Electron Beam In the analyzing method according to the second embodiment, correction of a spectrum shift resulting from deflection of an electron beam is performed with respect to a spectrum stored in each pixel of a spectrum map. The correction of the spectrum shift resulting from the deflection of the electron beam is performed based on information showing the relationship between a deflection amount of the electron beam and a spectrum shift amount.

<Method for Finding Relationship Between Deflection Amount of Electron Beam and Spectrum Shift Amount>

The analyzing method according to the second embodiment includes the step of acquiring information showing the relationship between a deflection amount of an electron beam and a spectrum shift amount. In the step of acquiring the information, an X-ray emitted from a standard specimen when the standard specimen is irradiated with an electron beam in a state in which the electron beam is not deflected is first detected while changing a position of the analyzing element 52 to acquire a reference spectrum. Next, an analysis to detect an X-ray emitted from the standard specimen when the standard specimen is irradiated with the electron beam in a state in which the electron beam is deflected while changing the position of the analyzing element 52 to acquire a comparison spectrum is repeatedly performed while changing a deflection amount of the electron beam to acquire a plurality of comparison spectra. Next, the reference spectrum is compared with each of the comparison spectra to acquire information showing the relationship between the deflection amount of the electron beam and a spectrum shift amount.

Figure 17:
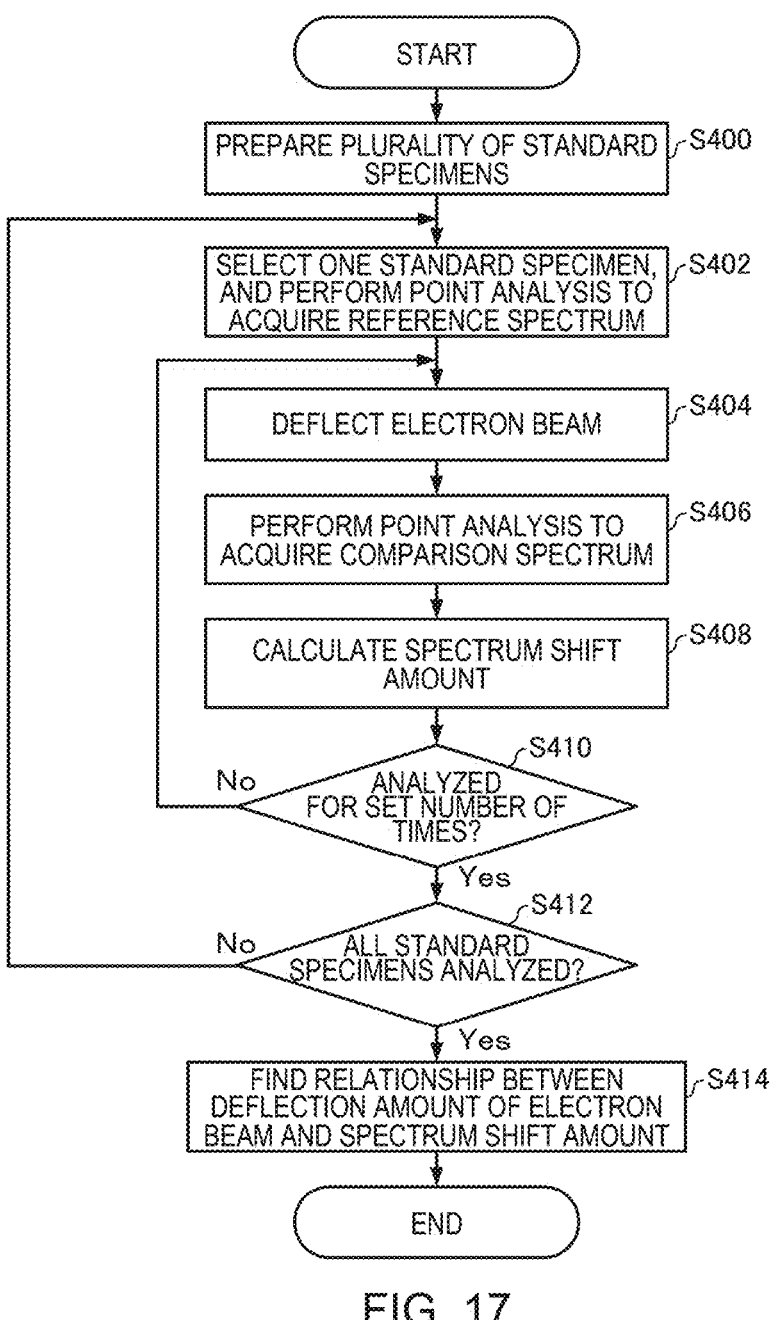
FIG. 17 is a flowchart illustrating an example of a method for finding a relationship between a deflection amount of an electron beam and a spectrum shift amount.

FIG. 17 is a flowchart illustrating an example of a method for finding the relationship between a deflection amount of an electron beam and a spectrum shift amount. Hereinafter, a case in which a PET crystal is used as the analyzing element 52 will be described. Further, descriptions of the same points as those of the processing illustrated in FIG. 8 described above will be omitted.

First, a plurality of standard specimens are prepared (S400).

A standard specimen made of Ti, a standard specimen made of Cd, a standard specimen made of Mo, and a standard specimen made of Si are, for example, available as the standard specimens.

Next, a point analysis is performed with respect to the standard specimen made of Ti to acquire a reference spectrum (S402).

The processing of step S402 to acquire the reference spectrum is performed in the same way as the processing of step S202 to acquire the reference spectrum illustrated in FIG. 8. Here, the reference spectrum of Ti is acquired. The reference spectrum is acquired in a state in which a condensing condition is satisfied, and a deflection amount of an electron beam is zero.

Next, an electron beam EB is deflected by a deflector 16 by a predetermined deflection amount (S404).

Figure 18:
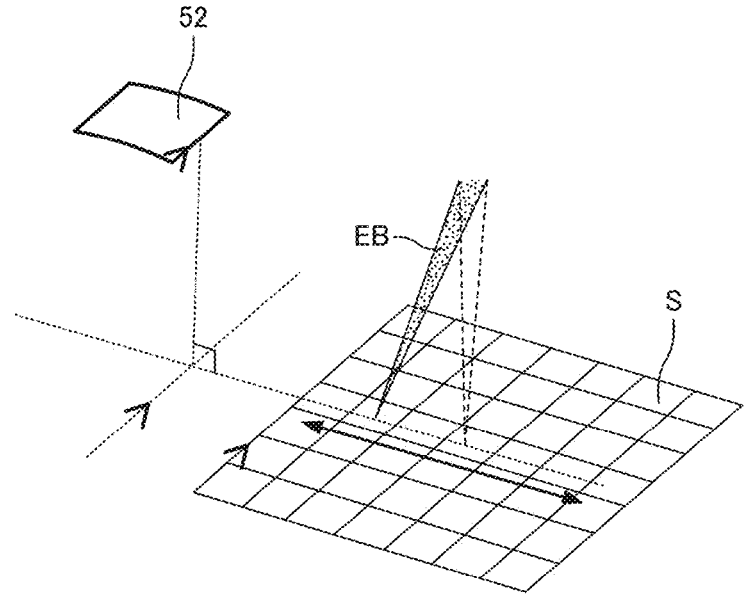
FIG. 18 is a diagram schematically illustrating a state in which an electron beam is deflected by a deflector.

FIG. 18 is a diagram schematically illustrating a state in which the electron beam EB is deflected by the deflector 16. As illustrated in FIG. 18, the electron beam EB is deflected in a direction perpendicular to a short side of the analyzing element 52. In this state, a point analysis is performed to acquire the spectrum (comparison spectrum) of Ti (S406). The comparison spectrum is a spectrum acquired in a state in which the electron beam is deflected.

Next, the reference spectrum is compared with the comparison spectrum to calculate a spectrum shift amount (S408). Specifically, a shift amount of the peak position of Ti in the comparison spectrum with respect to the peak position of Ti in the reference spectrum is calculated. Thus, calculation of the spectrum shift amount of the comparison spectrum with respect to the reference spectrum is allowed. That is, calculation of the spectrum shift amount in a case in which the electron beam EB is deflected by the predetermined deflection amount is allowed.

Next, determination is made as to whether a point analysis has been performed for a previously-set number of times (S410). When the point analysis has not been performed for the previously-set number of times (No in S410), the processing returns to step S404 to deflect the electron beam EB (S404), acquire a comparison spectrum of Ti (S406), and calculate a spectrum shift amount (S408). In the processing of step S404 to deflect the electron beam EB, a deflection amount of the electron beam is, for example, increased according to the number of repeating times.

As described above, the processing of step S404 to deflect the standard specimen, the processing of step S406 to acquire a comparison spectrum of Ti, and the processing of step S408 to calculate a spectrum shift amount are repeatedly performed until the point analysis is performed for the previously-set number of times. Thus, acquisition of a table of the deflection amount of the electron beam and the spectrum shift amount is allowed for the spectrum of Ti.

When the point analysis has been performed for the set number of times (Yes in S410), determination is made as to whether all the standard specimens have been analyzed (S412).

When all the standard specimens have not been analyzed (No in S412), the processing returns to step S402 to select the standard specimen made of Cd, perform the processing of steps S402, S404, S406, S408, and S410 and acquire the table of the deflection amount of the electron beam and the spectrum shift amount for the spectrum of Cd.

The processing of steps S402, S404, S406, S408, and S410 is repeatedly performed as described above to analyze the standard specimen made of Ti, the standard specimen made of Cd, the standard specimen made of Mo, and the standard specimen made of Si. As a result, acquisition of the table illustrating deflection amount of the electron beam and the spectrum shift amount is allowed for each of the spectrum of Ti, the spectrum of Cd, the spectrum of Mo, and the spectrum of Si.

When all the standard specimens have been analyzed (Yes in S412), the relationship between the deflection amount of the electron beam and the spectrum shift amount is found (S414).

Figure 19:
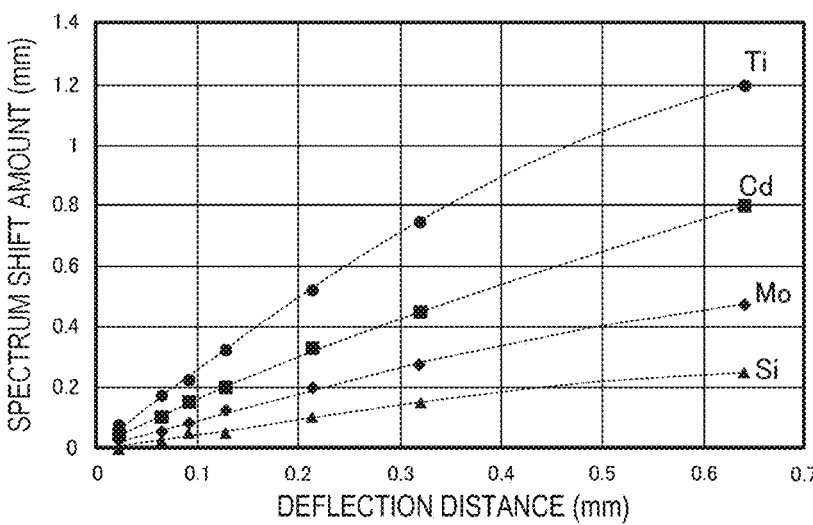
FIG. 19 is a graph illustrating a relationship between a deflection amount of an electron beam and a spectrum shift amount.

FIG. 19 is a graph illustrating the relationship between the deflection amount of the electron beam and the spectrum shift amount for each of the spectrum of Ti, the spectrum of Cd, the spectrum of Mo, and the spectrum of Si. In FIG. 19, a horizontal axis shows the deflection amount of the electron beam, and a vertical axis shows the spectrum shift amount. Note that the deflection amount shown in the horizontal axis is expressed as a deflection distance, and the deflection distance is the distance between the center of an observation visual field and an analysis point (irradiation position of the electron beam) on a specimen. The deflection distance becomes zero when the analysis point is at the center of the observation visual field. Further, the spectrum shift amount is expressed as a difference (mm) in an analyzing position L.

From the table of the deflection amount of the electron beam and the spectrum shift amount for each of the spectrum of Ti, the spectrum of Cd, the spectrum of Mo, and the spectrum of Si, the graph illustrated in FIG. 19 is generated. As illustrated in FIG. 19, the relationship between the deflection amount of the electron beam and the spectrum shift amount is found for each element, that is, for each energy (analyzing position L).

By the above step, finding of the relationship between the deflection amount of the electron beam and the spectrum shift amount is allowed.

Figure 20:
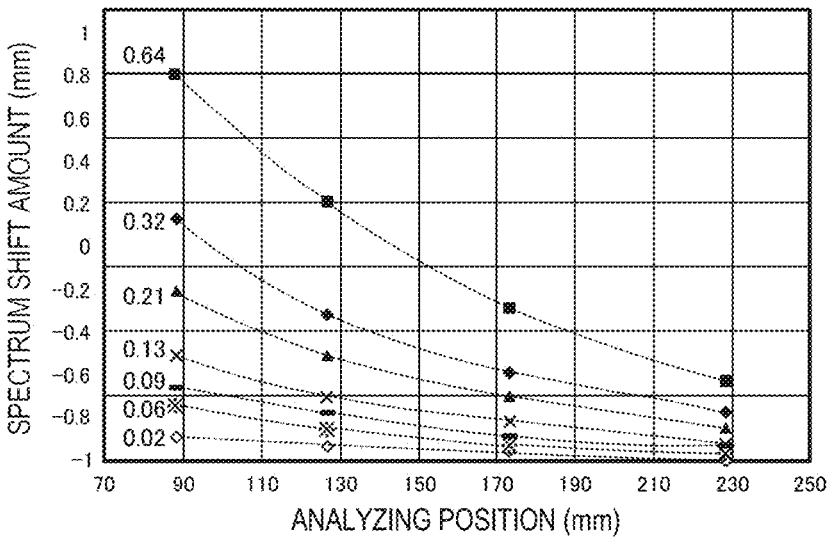
FIG. 20 is a graph illustrating a relationship between an analyzing position and a spectrum shift amount.

FIG. 20 is a graph illustrating the relationship between the analyzing position L and the spectrum shift amount for each deflection amount (deflection distance) of the electron beam.

The graph illustrated in FIG. 20 is obtained from the graph illustrated in FIG. 19. Specifically, an item (element) of the graph illustrated in FIG. 19 is converted into the horizontal axis of the graph illustrated in FIG. 20. At this time, the item (element) of the graph illustrated in FIG. 19 is expressed as the analyzing position L in the horizontal axis of the graph illustrated in FIG. 20. Moreover, the deflection distance shown in the horizontal axis of the graph illustrated in FIG. 19 is converted into an item of the graph illustrated in FIG. 20.

Thus, from the relationship between the deflection amount of the electron beam and the spectrum shift amount found for each element illustrated in FIG. 19, finding of the relational expression between the energy (analyzing position L) of a characteristic X-ray and the spectrum shift amount is allowed for each deflection amount of the electron beam illustrated in FIG. 20.

Information showing the relationship between the deflection amount of the electron beam and the spectrum shift amount for each element illustrated in FIG. 19 and information showing the relationship between the energy of the characteristic X-ray and the spectrum shift amount for each deflection amount of the electron beam illustrated in FIG. 20 are stored in a storage unit 74. Note that the relationship illustrated in FIG. 19 and the relationship illustrated in FIG. 20 are different from each other in their expressing ways, one of the information on the relationship illustrated in FIG. 19 and the information on the relationship illustrated in FIG. 20 is only required to be stored in the storage unit 74.

<Method for Correcting Spectrum Shift Resulting from Deflection of Electron Beam>

Next, a method for correcting a spectrum shift resulting from deflection of an electron beam will be described. Hereinafter, a case in which a shift of an Sc-Kα line resulting from the deflection of the electron beam is corrected will be described as an example of correcting the spectrum shift resulting from deflection of the electron beam.

First, from the relational expression illustrated in FIG. 20, the relationship between a deflection amount of the electron beam and a spectrum shift amount in the Sc-Kα line is found.

Figure 21:
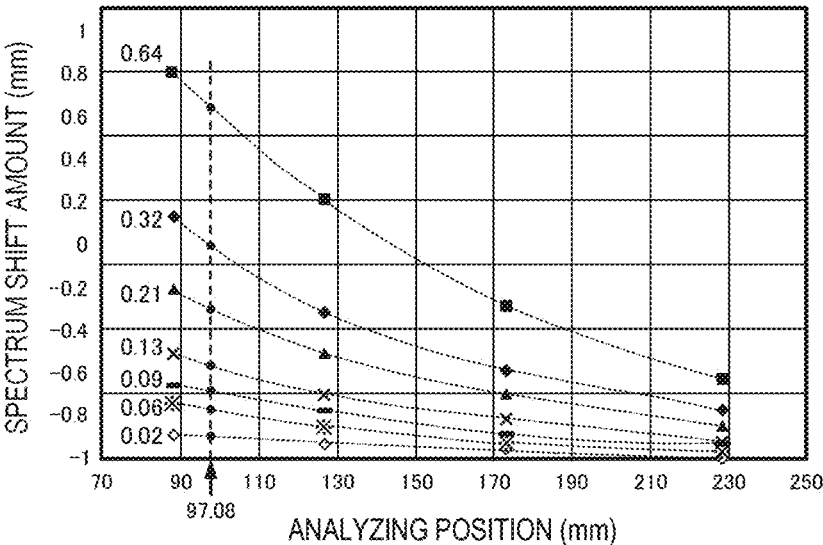
FIG. 21 is a graph for describing a method for finding a relationship between a deflection amount of an electron beam and a spectrum shift amount in an Sc-Kα line.

FIG. 21 is a graph for describing a method for finding the relationship between the deflection amount of the electron beam and the spectrum shift amount in the Sc-Kα line from the relational expression illustrated in FIG. 20.

As illustrated in FIG. 21, a straight line is drawn at the analyzing position L=97.08 mm showing the peak position of the Sc-Kα line, and an intersecting point between the straight line and the relational expression between the analyzing position L and the spectrum shift amount drawn for each deflection amount of the electron beam is found. The found intersecting points are plotted in a graph in which a horizontal axis shows a deflection distance and a vertical axis shows the spectrum shift amount. Thus, finding of the relational expression between the deflection amount of the electron beam and the spectrum shift amount in the Sc-Kα line is allowed.

Figure 22:
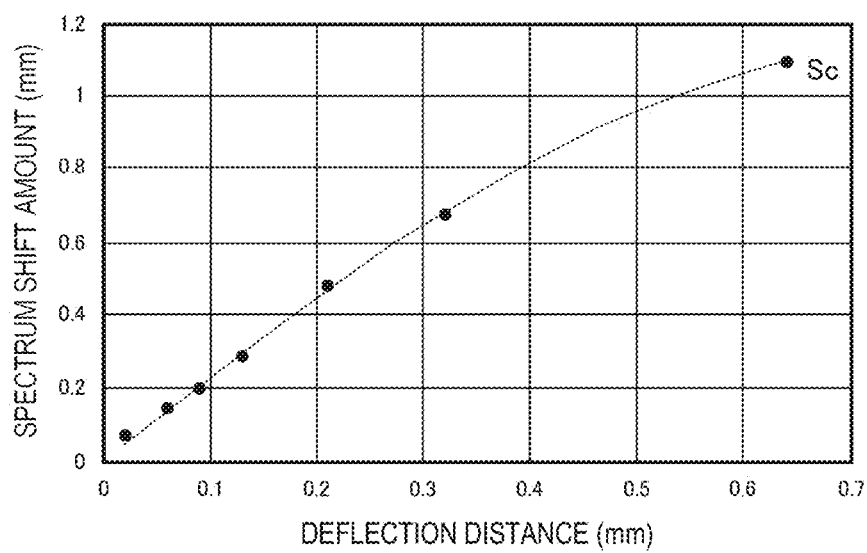
FIG. 22 is a graph illustrating a relational expression between a deflection amount of an electron beam and a spectrum shift amount in an Sc-Kα line.

FIG. 22 is a graph illustrating the relational expression between the deflection amount (deflection distance) of the electron beam and the spectrum shift amount in the Sc-Kα line.

Next, a peak spectrum shift of Sc of a spectrum stored in each pixel of a spectrum map is corrected using the relational expression illustrated in FIG. 22. Specifically, the spectrum shift amount is first calculated from the deflection amount (deflection distance) of the electron beam in each pixel using the relational expression illustrated in FIG. 22. The deflection amount (deflection distance) of the electron beam is calculatable from, for example, coordinates of each pixel. Next, the peak of Sc of an X-ray spectrum is shifted based on the calculated spectrum shift amount in each pixel.

By the above step, correction of the spectrum shift resulting from the deflection of the electron beam is allowed.

Note that one peak is a correction target in the above but a plurality of peaks may be correction targets. When a plurality of peaks are correction targets, the above correction is only required to be made to each of the plurality of peaks that are the correction targets.

<Correction Processing of Spectrum Shift Resulting from Deflection of Electron Beam>

Figure 23:
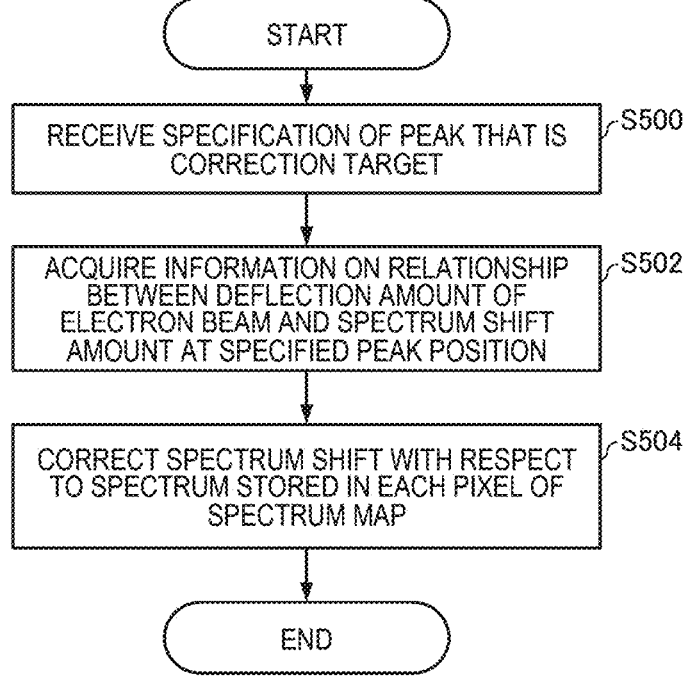
FIG. 23 is a flowchart illustrating an example of correction processing of a spectrum shift resulting from deflection of an electron beam in a control unit.

FIG. 23 is a flowchart illustrating an example of correction processing of a spectrum shift resulting from deflection of an electron beam in a control unit 60.

The control unit 60 receives specification of a peak that is a correction target (S500). The control unit 60 reads the relational expression stored in advance in the storage unit 74 and illustrated in FIG. 19, and finds information showing the relationship between a deflection amount of the electron beam and a spectrum shift amount at the peak position specified based on the relational expression (S502). Thus, acquisition of the information showing the relationship between the deflection amount of the electron beam and the spectrum shift amount at the specified peak position is allowed.

Next, the control unit 60 corrects a spectrum shift with respect to a spectrum stored in each pixel of a spectrum map based on the information showing the relationship between the deflection amount of the electron beam and the spectrum shift amount (S504).

By the above processing, correction of the spectrum shift resulting from the deflection of the electron beam is allowed.

Experimental Example

A point analysis was performed while changing a deflection amount of an electron beam to acquire the spectrum of Sc.

Figure 24:
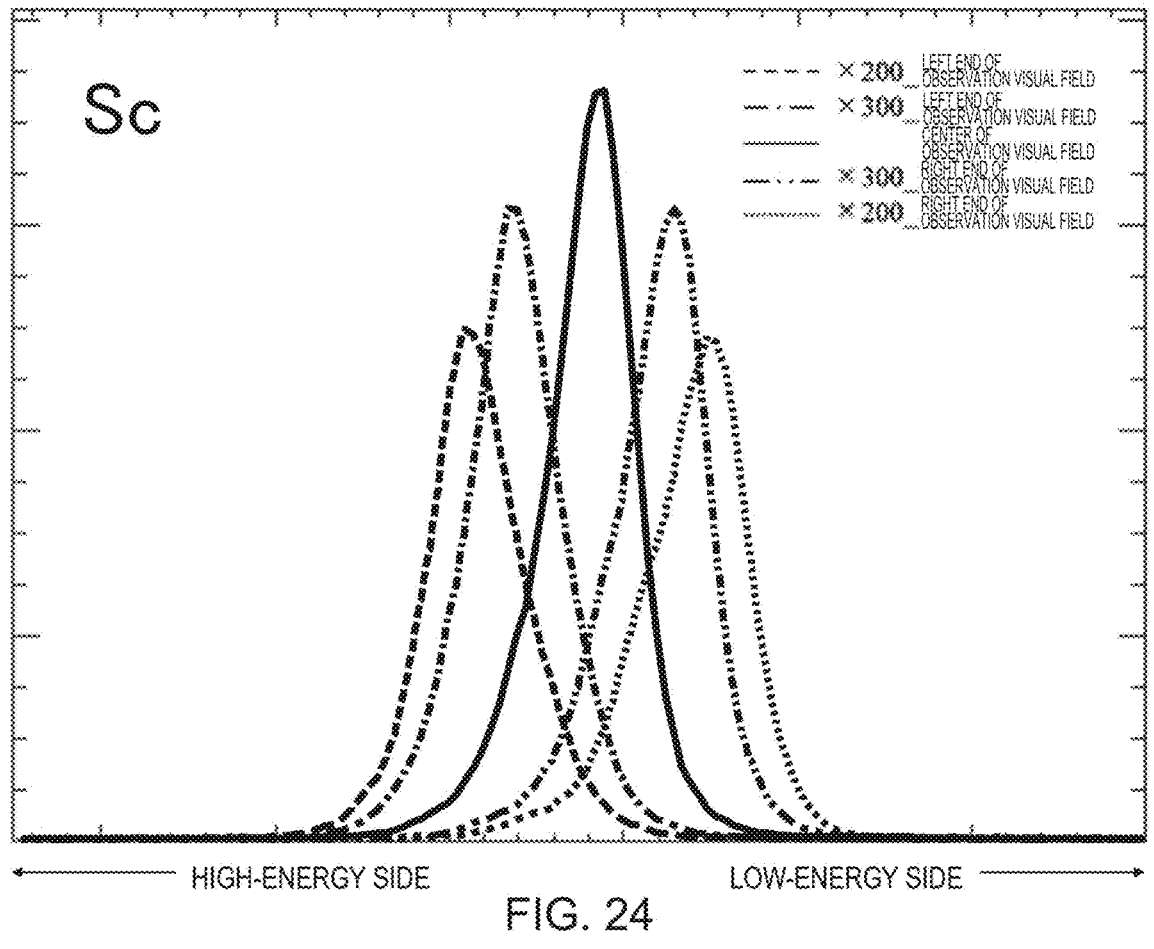
FIG. 24 is a graph illustrating a plurality of spectra acquired by performing a point analysis while changing a deflection amount of an electron beam with respect to a specimen containing Sc.

FIG. 24 is a graph illustrating a plurality of spectra of Sc acquired by performing a point analysis while changing a deflection amount of an electron beam with respect to the specimen containing Sc. Here, the spectrum of Sc was acquired in each of a case in which an analysis point (irradiation position of an electron beam) is at the center of an observation visual field, a case in which the analysis point is at the left end of the observation visual field with an observation magnification of 300 times (deflection amount: 0.21333 . . . mm), a case in which the analysis point was at the left end of the observation visual field with an observation magnification of 200 times (deflection amount: 0.32 mm), a case in which the analysis point was at the right end of the observation visual field with an observation magnification of 300 times, and a case in which the analysis point was at the right end of the observation visual field with an observation magnification of 200 times. When the analysis point is at the center of the observation visual field, the analysis point on the specimen is positioned on a Rowland circle, and a condensing condition is satisfied. It is apparent from the plurality of spectra of Sc illustrated in FIG. 24 that a spectrum shift amount is large when a deflection amount of the electron beam is large.

In the plurality of spectra of Sc illustrated in FIG. 24, the spectrum shifts resulting from the displacement of the electron beam were corrected. Specifically, from the deflection amounts of the electron beam obtained when the respective spectra were acquired, the spectrum shift amounts in the respective spectra were calculated using the relational expression between the deflection amount of the electron beam and the spectrum shift amount illustrated in FIG. 22. Then, the spectra were shifted based on the spectrum shift amounts calculated in the respective spectra.

Figure 25:
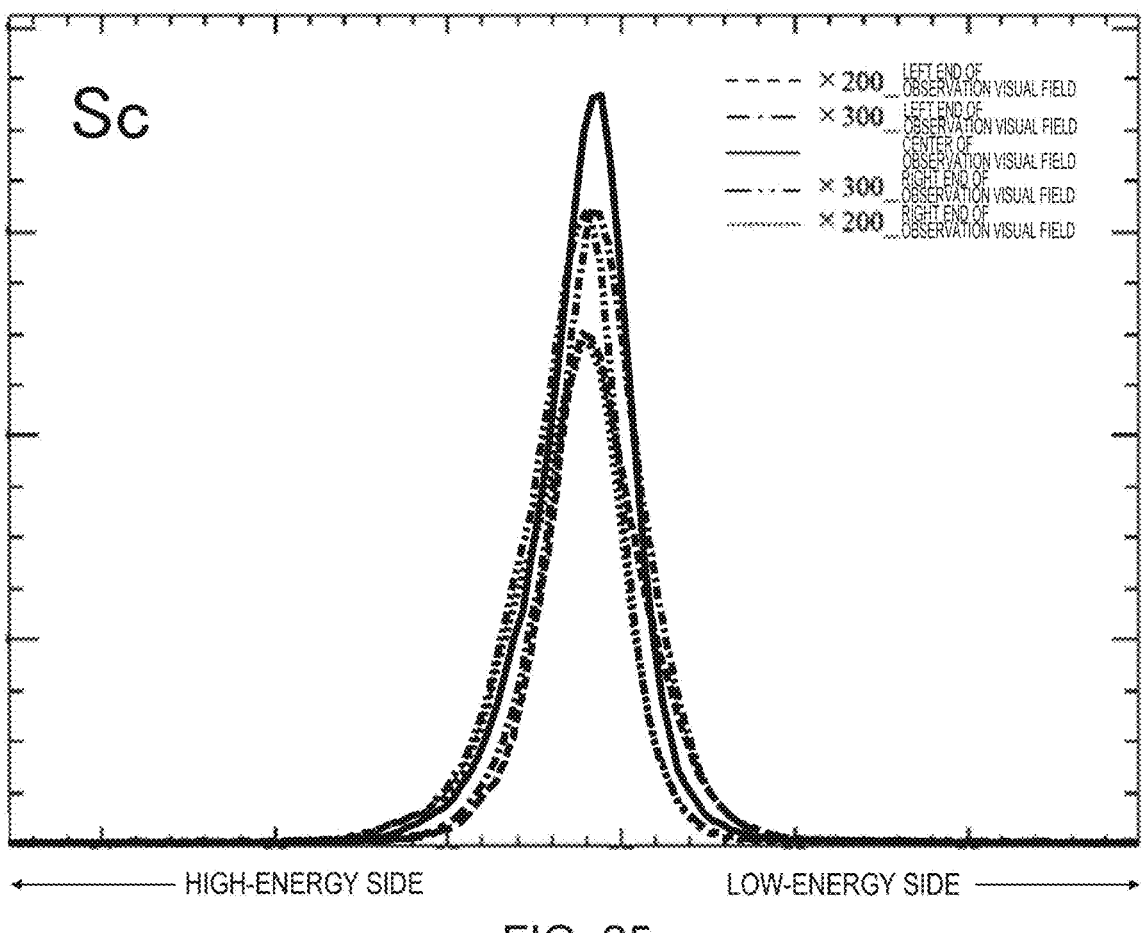
FIG. 25 is a graph illustrating results obtained by correcting spectrum shifts resulting from deflection of an electron beam in respective spectrums of Sc.

FIG. 25 is a graph illustrating results obtained by correcting the spectrum shifts resulting from deflection of the electron beam in the respective spectrums of Sc illustrated in FIG. 24. As illustrated in FIG. 25, the positions of the peaks of the respective spectra acquired under different deflection amounts of the electron beam were coincident with each other as a result of the correction. Accordingly, the spectrum shifts resulting from the deflection of the electron beam were accurately corrected.

2.3.2. Correction of Reduction in X-Ray Intensity Resulting from Deflection of Electron Beam In the analyzing method according to the second embodiment, correction of a reduction in X-ray intensity resulting from deflection of an electron beam is performed with respect to a spectrum stored in each pixel of a spectrum map. The correction of the reduction in the X-ray intensity resulting from the deflection of the electron beam is performed based on information showing the relationship between a deflection amount of the electron beam and a reduction ratio of the X-ray intensity.

<Method for Finding Relationship Between Deflection Amount of Electron Beam and Reduction Ratio of X-Ray Intensity>

The analyzing method according to the second embodiment includes the step of acquiring information showing the relationship between a deflection amount of an electron beam and a reduction ratio of X-ray intensity. In the step of acquiring the information, an X-ray emitted from a standard specimen when the standard specimen is irradiated with an electron beam in a state in which the electron beam is not deflected is first detected while changing a position of the analyzing element 52 to acquire a reference spectrum. Next, an analysis to detect an X-ray emitted from the standard specimen when the standard specimen is irradiated with the electron beam in a state in which the electron beam is deflected while changing the position of the analyzing element 52 to acquire a comparison spectrum is repeatedly performed while changing a deflection amount of the electron beam to acquire a plurality of comparison spectra. Next, the reference spectrum is compared with each of the comparison spectra to acquire information showing the relationship between the deflection amount of the electron beam and a reduction ratio of the X-ray intensity.

Figure 26:
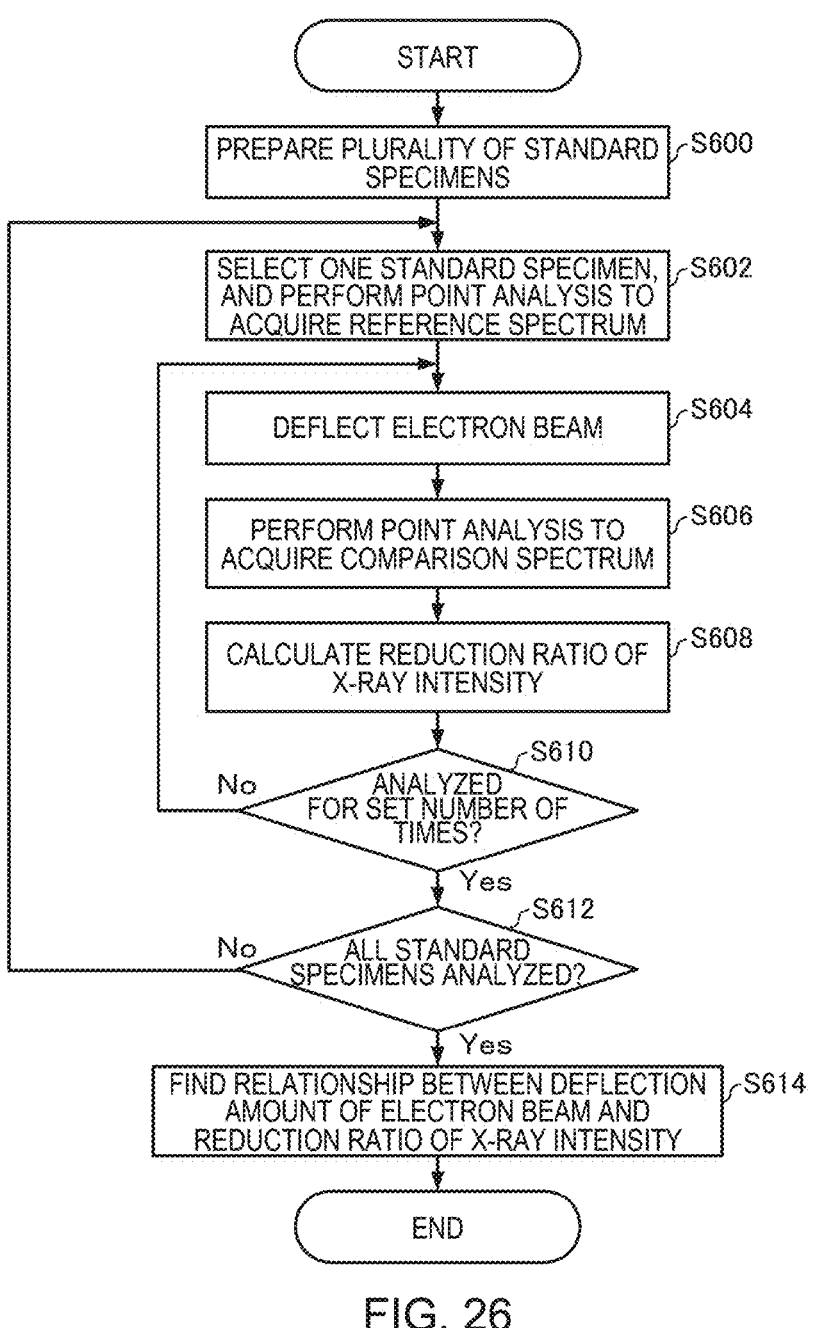
FIG. 26 is a flowchart illustrating an example of a method for finding a relationship between a deflection amount of an electron beam and a reduction ratio of X-ray intensity.

FIG. 26 is a flowchart illustrating an example of a method for finding the relationship between a deflection amount of an electron beam and a reduction ratio of X-ray intensity. Hereinafter, a case in which a PET crystal is used as the analyzing element 52 will be described. Further, descriptions of the same points as those of the above correction processing illustrated in FIG. 17 will be omitted.

First, a plurality of standard specimens are prepared (S600).

A standard specimen made of Ti, a standard specimen made of Cd, a standard specimen made of Mo, and a standard specimen made of Si are, for example, available as the standard specimens.

Next, a point analysis is performed with respect to the standard specimen made of Ti to acquire a reference spectrum (S602).

The processing of step S602 to acquire the reference spectrum is performed in the same way as the processing of step S402 to acquire the reference spectrum illustrated in FIG. 17. Here, the reference spectrum of Ti is acquired. The reference spectrum is acquired in a state in which a condensing condition is satisfied, and a deflection amount of an electron beam is zero.

Next, an electron beam EB is deflected by a deflector 16 by a predetermined deflection amount (S604).

As illustrated in FIG. 18, a point analysis is performed in a state in which the electron beam EB is deflected in a direction perpendicular to a short side of the analyzing element 52 to acquire the spectrum (comparison spectrum)

of Ti (S606). The comparison spectrum is a spectrum acquired in a state in which the electron beam is deflected.

Next, the X-ray intensity of the reference spectrum is compared with the X-ray intensity of the comparison spectrum to calculate a reduction ratio of the X-ray intensity (S608). Specifically, the ratio of the peak X-ray intensity of Ti in the comparison spectrum to the peak X-ray intensity of Ti in the reference spectrum is calculated. Thus, calculation of the reduction ratio of the X-ray intensity in a case in which the electron beam EB is deflected by the predetermined deflection amount is allowed.

Next, determination is made as to whether a point analysis has been performed for a previously-set number of times (S610). When the point analysis has not been performed for the previously-set number of times (No in S610), the processing returns to step S604 to deflect the electron beam EB (S604), acquire a comparison spectrum of Ti (S606), and calculate a reduction ratio of the X-ray intensity (S608). In the processing of step S604 to deflect the electron beam EB, a deflection amount of the electron beam is, for example, increased according to the number of repeating times.

As described above, the processing of step S604 to deflect the electron beam, the processing of step S606 to perform a point analysis, and the processing of step S608 to calculate a reduction ratio of X-ray intensity are repeatedly performed until the point analysis is performed for the previously-set number of times. Thus, acquisition of a table of the deflection amount of the electron beam and the reduction ratio of the X-ray intensity is allowed for the spectrum of Ti.

When the point analysis has been performed for the set number of times (Yes in S610), determination is made as to whether all the standard specimens have been analyzed (S612).

When all the standard specimens have not been analyzed (No in S612), the processing returns to step S602 to select the standard specimen made of Cd, perform the processing of steps S602, S604, S606, S608, and S610 and acquire the table of the deflection amount of the electron beam and the reduction ratio of the X-ray intensity for the spectrum of Cd.

The processing of steps S602, S604, S606, S608, and S610 is repeatedly performed as described above to analyze the standard specimen made of Ti, the standard specimen made of Cd, the standard specimen made of Mo, and the standard specimen made of Si. As a result, acquisition of the table of the deflection amount of the electron beam and the reduction ratio of the X-ray intensity is allowed for each of the spectrum of Ti, the spectrum of Cd, the spectrum of Mo, and the spectrum of Si.

When all the standard specimens have been analyzed (Yes in S612), the relationship between the deflection amount of the electron beam and the reduction ratio of the X-ray intensity is found (S614).

Figure 27:
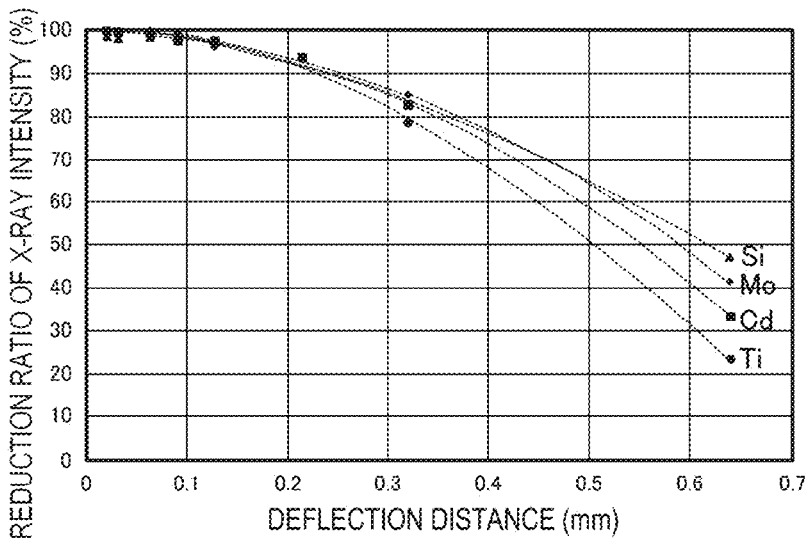
FIG. 27 is a graph illustrating a relationship between a deflection amount of an electron beam and a reduction ratio of X-ray intensity.

FIG. 27 is a graph illustrating the relationship between the deflection amount of the electron beam and the reduction ratio of the X-ray intensity for each of the spectrum of Ti, the spectrum of Cd, the spectrum of Mo, and the spectrum of Si. In the graph of FIG. 27, a horizontal axis shows the deflection amount of the electron beam, and a vertical axis shows the reduction ratio of the X-ray intensity.

The reduction ratio of the X-ray intensity is the ratio of the X-ray intensity in a comparison spectrum to the X-ray intensity in a reference spectrum. Note that the deflection amount of the electron beam shown in the horizontal axis is expressed as a deflection distance.

From the table of the deflection amount of the electron beam and the reduction ratio of the X-ray intensity for each of the spectrum of Ti, the spectrum of Cd, the spectrum of Mo, and the spectrum of Si, the graph illustrated in FIG. 27 is generated.

By the above step, finding of the relationship between the deflection amount of the electron beam and the reduction ratio of the X-ray intensity is allowed.

Figure 28:
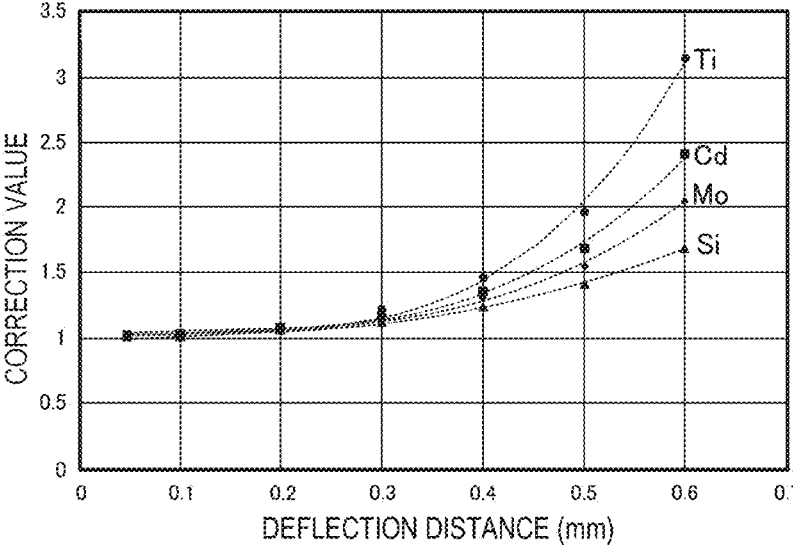
FIG. 28 is a graph illustrating a relationship between a deflection distance and a correction value for correcting X-ray intensity.

FIG. 28 is a graph illustrating the relationship between a deflection distance and a correction value for correcting the X-ray intensity.

The graph illustrating the relationship between the deflection distance and the correction value illustrated in FIG. 28 is generated from the graph illustrated in FIG. 27. The correction value is a coefficient used to make a value of X-ray intensity reduced by deflection of the electron beam the same as a value of the X-ray intensity of a reference spectrum. Correction of the X-ray intensity is allowed by multiplying the X-ray intensity of a spectrum by the correction value. As illustrated in FIG. 28, the correction value is expressed as a function that increases with an increase in a deflection amount of the electron beam.

Figure 29:
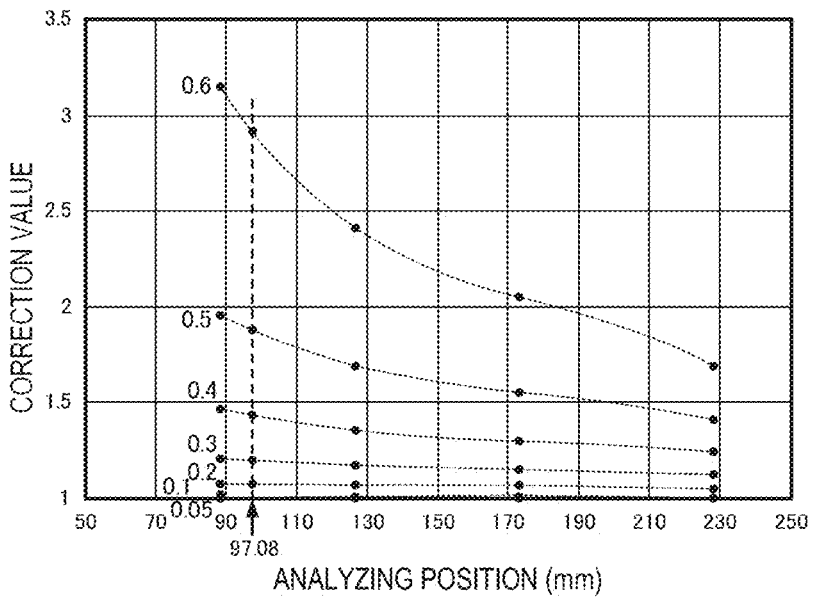
FIG. 29 is a graph illustrating a relationship between an analyzing position and a correction value.

FIG. 29 is a graph illustrating the relationship between an analyzing position L and the correction value for each deflection amount of the electron beam.

An item of the graph illustrated in FIG. 28 is converted into the horizontal axis of the graph illustrated in FIG. 29, and the horizontal axis of the graph illustrated in FIG. 28 is converted into an item of the graph illustrated in FIG. 29. Thus, finding of the relational expression between the analyzing position L and the correction value is allowed for each deflection amount of the electron beam illustrated in FIG. 29.

Information showing the relationship between the deflection amount of the electron beam and the reduction ratio of the X-ray intensity for each element illustrated in FIG. 27, information showing the relationship between the deflection distance of the correction value for each element illustrated in FIG. 28, and information showing the relationship between the analyzing position L and the correction value for each deflection amount of the electron beam illustrated in FIG. 29 are stored in the storage unit 74. Note that the relationship illustrated in FIG. 27, the relationship illustrated in FIG. 28, and the relationship illustrated in FIG. 29 are different from each other in their expressing ways, one of the information on the relationship illustrated in FIG. 27, the information on the relationship illustrated in FIG. 28, and the information on the relationship illustrated in FIG. 29 is only required to be stored in the storage unit 74.

<Method for Correcting Reduction in X-Ray Intensity Resulting from Deflection of Electron Beam>

Next, a method for correcting a method for correcting a reduction in X-ray intensity resulting from deflection of an electron beam will be described. Hereinafter, a case in which a reduction in the peak X-ray intensity of an Sc-Kα line resulting from the deflection of the electron beam is corrected will be described as an example of correcting the reduction in the X-ray intensity resulting from deflection of the electron beam.

First, from the relational expression illustrated in FIG. 29, the relationship between a deflection amount of the electron beam and a correction value in the Sc-Kα line is found. Specifically, in the graph illustrated in FIG. 29, a straight line is drawn at the analyzing position L=97.08 mm showing the peak position of the Sc-Kα line, and an intersecting point between the straight line and the relational expression between the analyzing position L and the correction value drawn for each deflection amount of the electron beam is found. The found intersecting points are plotted in a graph in which a horizontal axis shows a deflection distance and a vertical axis shows the correction value. Thus, finding of the relational expression between the deflection amount of the electron beam and the correction value in the Sc-Kα line is allowed.

Figure 30:
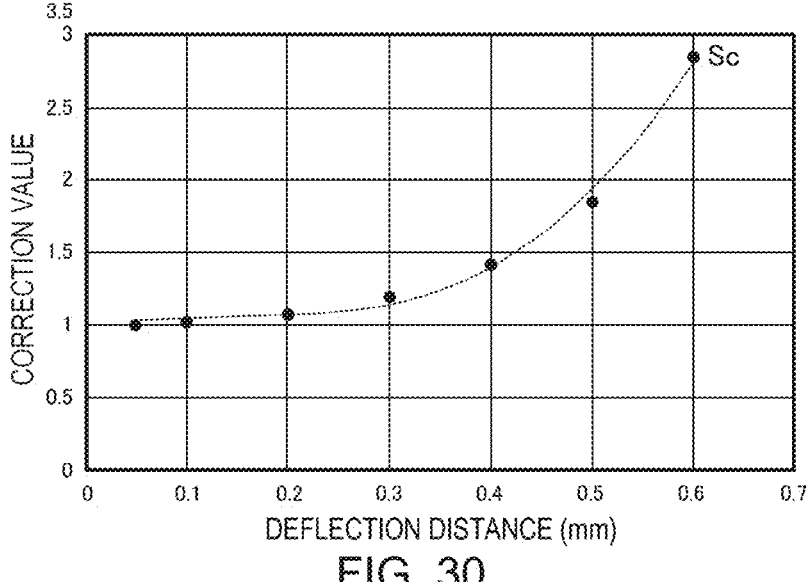
FIG. 30 is a graph illustrating a relationship between a deflection amount of an electron beam and a correction value in an Sc-Kα line.

FIG. 30 is a graph illustrating the relationship between the deflection amount of the electron beam and the correction value in the SC-Kα line.

Next, the peak X-ray intensity of Sc of a spectrum stored in each pixel of a spectrum map is corrected using the relational expression illustrated in FIG. 30. Specifically, the correction value is first calculated from the deflection amount (deflection distance) of the electron beam in each pixel using the relational expression illustrated in FIG. 30. Next, the peak intensity of Sc of an X-ray spectrum is multiplied by the calculated correction value in each pixel. Thus, correction of a reduction in the peak X-ray intensity of Sc resulting from deflection of the electron beam is allowed.

By the above step, correction of the reduction in the X-ray intensity resulting from the deflection of the electron beam is allowed.

Note that one peak is a correction target in the above but a plurality of peaks may be correction targets. When a plurality of peaks are correction targets, the above correction is only required to be made to each of the plurality of peaks that are the correction targets.

<Correction Processing of Reduction in X-Ray Intensity Resulting from Deflection of Electron Beam>

Figure 31:
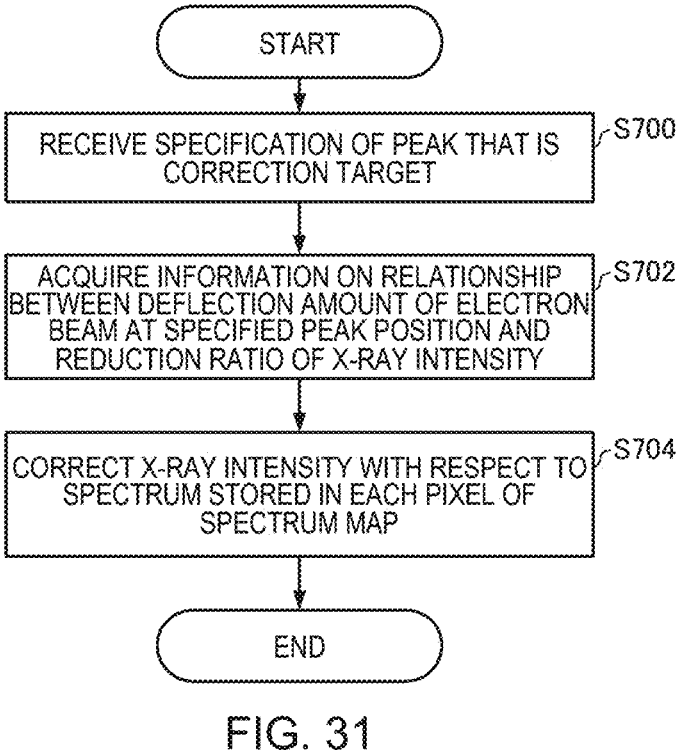
FIG. 31 is a flowchart illustrating an example of correction processing of a reduction in X-ray intensity resulting from deflection of an electron beam in a control unit.

FIG. 31 is a flowchart illustrating an example of correction processing of a reduction in X-ray intensity resulting from deflection of an electron beam in a control unit 60.

First, the control unit 60 receives specification of a peak that is a correction target (S700). The control unit 60 reads the relational expression stored in advance in the storage unit 74 and illustrated in FIG. 27, and finds information showing the relationship between a deflection amount of the electron beam and a correction value (reduction ratio of X-ray intensity) at a peak position specified based on the relational expression (S702). Thus, acquisition of the information showing the relationship between the deflection amount of the electron beam and the correction value (reduction ratio of X-ray intensity) at the specified peak position is allowed.

Next, the control unit 60 corrects the X-ray intensity with respect to a spectrum stored in each pixel of a spectrum map based on the information showing the relationship between the deflection amount of the electron beam and the correction value (reduction ratio of the X-ray intensity) (S704).

By the above processing, correction of the reduction in the X-ray intensity resulting from the deflection of the electron beam is allowed.

Experimental Example

Each spectrum of Sc illustrated in FIG. 24 was acquired, and map data of an Sc-Kα line with an observation magnification of 200 times was generated based on each spectrum of Sc illustrated in FIG. 24.

Figure 32:
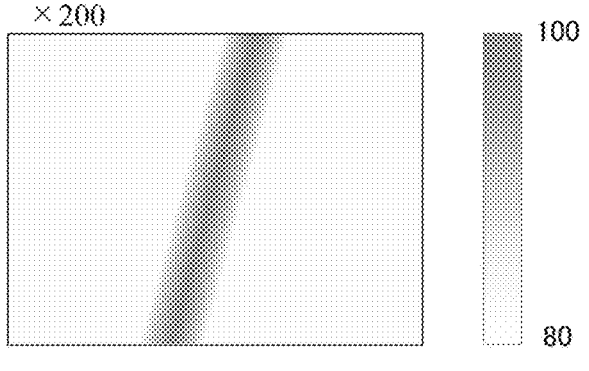
FIG. 32 is a simulation result of map data of an Sc-Kα line with an observation magnification of 200 times.

FIG. 32 is a simulation result of the map data of the Sc-Kα line with an observation magnification of 200 times.

In the map data illustrated in FIG. 32, a mapping analysis based on beam scanning was reproduced. In the map data illustrated in FIG. 32, the X-ray intensity (minimum X-ray intensity) at the end of an observation visual field was 11.9 when the peak intensity (maximum X-ray intensity) of a spectrum acquired at the center of the observation visual field was 100. As described above, the X-ray intensity largely reduces at the end of the observation visual field with a reduction in the spectrum shift and the X-ray intensity resulting from deflection of an electron beam.

Next, the spectrum shift resulting from the deflection of the electron beam was corrected with respect to the map data illustrated in FIG. 32. Specifically, a spectrum stored in each pixel of the map data illustrated in FIG. 32 was shifted based on the relationship between the deflection amount of the electron beam and the spectrum shift amount illustrated in FIG. 22.

Figure 33:
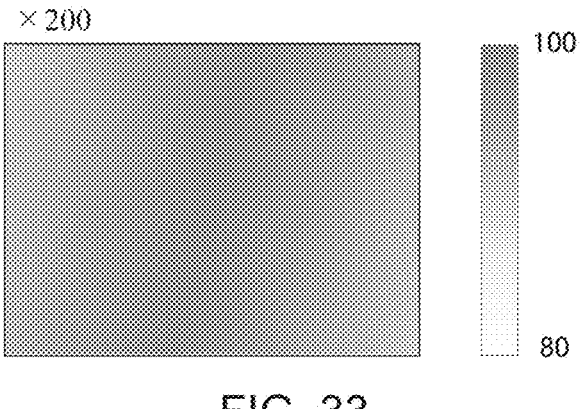
FIG. 33 is a simulation result of map data obtained by correcting a spectrum shift resulting from deflection of an electron beam.

FIG. 33 is a simulation result of map data obtained by correcting a spectrum shift resulting from deflection of an electron beam.

In the map data illustrated in FIG. 33, the X-ray intensity (minimum X-ray intensity) at the end of an observation visual field was 88.5 when the peak intensity (maximum X-ray intensity) of the spectrum acquired at the center of the observation visual field was 100. As described above, correction of the X-ray intensity was also allowed with the correction of the spectrum shift.

Next, the reduction in the X-ray intensity resulting from the deflection of the electron beam was corrected with respect to the map data illustrated in FIG. 33. Specifically, the X-ray intensity of a spectrum stored in each pixel of the map data illustrated in FIG. 33 was corrected based on the relationship between the deflection amount of the electron beam and the correction value (reduction ratio of the X-ray intensity) illustrated in FIG. 30.

Figure 34:
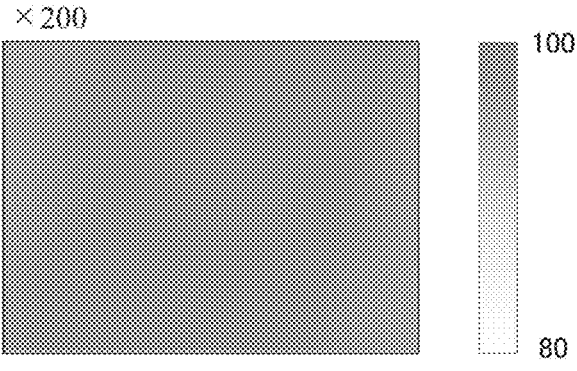
FIG. 34 is a simulation result of map data obtained by correcting a spectrum shift and reduction in X-ray intensity resulting from deflection of an electron beam.

FIG. 34 is a simulation result of map data obtained by correcting the spectrum shift and the reduction in X-ray intensity resulting from deflection of an electron beam.

In the map data illustrated in FIG. 34, the X-ray intensity (minimum X-ray intensity) at the end of the observation visual field was 96.7 when the peak intensity (maximum X-ray intensity) of a spectrum acquired at the center of the observation visual field was 100. As described above, an error in the X-ray intensity fell within ±3% in the whole observation visual field with the correction of the spectrum shift and the X-ray intensity. Accordingly, the reduction in the spectrum shift and the X-ray intensity resulting from the deflection of the electron beam was accurately corrected.

2.4. Effects

In the analyzing method according to the second embodiment, the electron beam EB is deflected by the deflector 16 to scan the specimen S with the electron beam EB in the step of acquiring a plurality of map data. Further, the analyzing method according to the second embodiment includes the step of correcting a spectrum shift resulting from deflection of an electron beam in a spectrum stored in each pixel of a spectrum map. In the step of correcting the spectrum shift, the spectrum shift is corrected based on information showing the relationship between a deflection amount of the electron beam and a spectrum shift amount.

As described above, scanning of the specimen S is allowed by beam scanning in the analyzing method according to the second embodiment. Therefore, a mapping analysis is allowed in a short period of time compared with a case in which the specimen S is scanned by stage scanning. Accordingly, spectrum imaging is allowed in a short period of time in the analyzing method according to the second embodiment. Moreover, correction of a spectrum shift resulting from deflection of the electron beam is allowed in the analyzing method according to the second embodiment.

The analyzing method according to the second embodiment includes the step of acquiring information showing the relationship between a deflection amount of the electron beam and a spectrum shift amount. In the step of acquiring the information, an X-ray emitted from a standard specimen when the standard specimen is irradiated with the electron beam in a state in which the electron beam is not deflected is first detected while changing a position of the analyzing element 52 to acquire a reference spectrum. Next, an analysis to detect an X-ray emitted from the standard specimen when the standard specimen is irradiated with the electron beam in a state in which the electron beam is deflected while changing the position of the analyzing element 52 to acquire a comparison spectrum is repeatedly performed while changing a deflection amount of the electron beam to acquire a plurality of comparison spectra. After that, a spectrum shift amount of each of the comparison spectra with respect to the reference spectrum is calculated to acquire the information.

Therefore, acquisition of information showing the relationship between a deflection amount of an electron beam and a spectrum shift amount is allowed in the analyzing method according to the second embodiment.

The analyzing method according to the second embodiment includes: the step of correcting a reduction in X-ray intensity resulting from deflection of an electron beam in an X-ray spectrum stored in each pixel of a spectrum map. Further, in the step of correcting the reduction in the X-ray intensity, the reduction in the X-ray intensity is corrected based on information showing the relationship between a deflection amount of the electron beam and a reduction ratio of the X-ray intensity. Therefore, correction of a reduction in X-ray intensity resulting from deflection of an electron beam is allowed in the analyzing method according to the second embodiment.

The analyzing method according to the second embodiment includes the step of acquiring information showing the relationship between a deflection amount of an electron beam and a reduction ratio of X-ray intensity. Further, in the step of acquiring the information, an X-ray emitted from a standard specimen when the standard specimen is irradiated with the electron beam in a state in which the electron beam is not deflected is first detected while changing a position of the analyzing element 52 to acquire a reference spectrum. Next, an analysis to detect an X-ray emitted from the standard specimen when the standard specimen is irradiated with the electron beam in a state in which the electron beam is deflected while changing the position of the analyzing element 52 to acquire a comparison spectrum is repeatedly performed while changing a deflection amount of the electron beam to acquire a plurality of comparison spectra. After that, the X-ray intensity of the reference spectrum is compared with the X-ray intensity of each of the comparison spectra to acquire the information.

Therefore, acquisition of information showing the relationship between a deflection amount of an electron beam and a reduction ratio of X-ray intensity is allowed in the analyzing method according to the second embodiment.

As described above, correction of a spectrum shift and a reduction in X-ray intensity resulting from deflection of an electron beam is allowed in the analyzing method according to the second embodiment. Therefore, a mapping analysis with a low magnification is allowed using beam scanning in the analyzing method according to the second embodiment. Accordingly, acquisition of a spectrum map with a low magnification is allowed in a short period of time in the analyzing method according to the second embodiment.

The analyzer 100 includes the storage unit 74 in which information showing the relationship between a deflection amount of an electron beam and a spectrum shift amount is stored. Therefore, the analyzer 100 is allowed to correct a spectrum shift resulting from deflection of an electron beam with respect to a spectrum stored in each pixel of a spectrum map.

The analyzer 100 includes the storage unit 74 in which information showing the relationship between a deflection amount of an electron beam and a reduction ratio of X-ray intensity is stored. Therefore, the analyzer 100 is allowed to correct a reduction in the intensity of an X-ray resulting from deflection of an electron beam with respect to a spectrum stored in each pixel of a spectrum map.

3. Third Embodiment

3.1. Analyzer

Next, an analyzing method according to the third embodiment will be described. Hereinafter, points of the analyzing method according to the third embodiment that are different from those of the analyzing methods according to the first and second embodiments will be described, and descriptions of the same points will be omitted.

An analyzer used in the analyzing method according to the third embodiment is the same as the above analyzer 100 illustrated in FIGS. 1 and 2, and its description will be omitted.

3.2. Spectrum Imaging

In spectrum imaging, a mapping analysis is performed by the number of analysis points of an X-ray spectrum stored in each pixel. Therefore, the spectrum imaging has a problem in that it takes a long time to perform an analysis.

Accordingly, in the analyzing method according to the third embodiment, information on an element contained in a specimen S is acquired in advance, and an interval at which a position of an analyzing element 52 is changed is set based on the information on the element contained in the specimen S. Thus, a reduction in the number of times for performing a mapping analysis is allowed in the analyzing method according to the third embodiment. Accordingly, spectrum imaging is allowed in a short period of time in the analyzing method according to the third embodiment.

Figure 35:
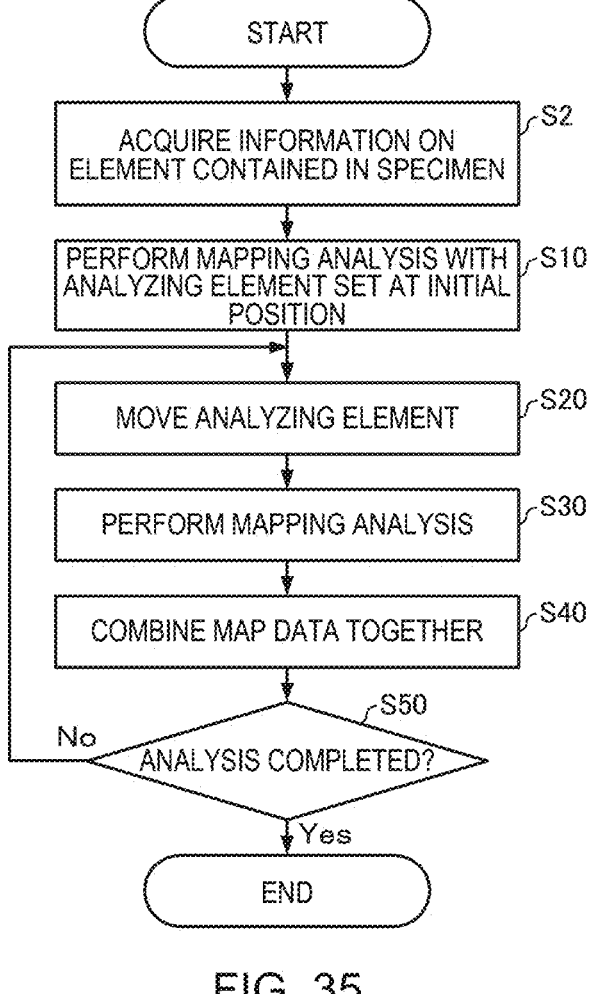
FIG. 35 is a flowchart illustrating an example of an analyzing method according to the third embodiment.

FIG. 35 is a flowchart illustrating an example of the analyzing method according to the third embodiment. The analyzing method according to the third embodiment is the same as the analyzing method according to the first embodiment illustrated in FIG. 6 except that the step of acquiring information on an element contained in a specimen S is included, and that an interval at which a position of the analyzing element 52 is changed is set based on the information on the element contained in the specimen S. Hereinafter, points of the analyzing method according to the third embodiment that are different from those of the analyzing method according to the first embodiment will be described, and descriptions of the same points will be omitted.

In the processing of step S2 to acquire information on an element contained in the specimen S, the specimen S is measured using an X-ray fluorescence spectrometer (XRF) to acquire the information on the element contained in the specimen S. According to an analysis result of the XRF, acquisition of the information on the element contained in the specimen S is allowed. Although not shown in the figures, the analyzer 100 may include the XRF.

Here, the XRF excites an X-ray, and therefore less generates a continuous X-ray and has a lower background compared with an EDS that excites an electron beam. For this reason, the XRF is allowed to perform a high-sensitivity analysis in a short period of time. Further, the XRF is allowed to detect an element contained in a region of a WDS in which a mapping analysis is performed at once. As described above, the XRF is capable of acquiring information on a slight amount of an element in a short period of time.

Note that the case in which information on an element contained in the specimen S is acquired using the XRF is described here. However, a method for acquiring information on an element contained in the specimen S is not limited so long as acquisition of the information on the element contained in the specimen S is easily allowed.

For example, information on an element contained in the specimen S may be acquired using an EDS 40. Compared with the WDS, the EDS 40 is capable of acquiring information on an element contained in the specimen S in a shorter period of time. Further, information on an element contained in the specimen S may be acquired by, for example, setting an analyzing condition measurable in a short period of time in spectrum imaging using five WDS mounted in the analyzer 100. The spectrum imaging is made possible in a short period of time by, for example, reducing the number of pixels in a mapping analysis. Further, the spectrum imaging is made possible in a short period of time by, for example, reducing a staying time per point in performing a mapping analysis.

In the processing of step S20 to move the analyzing element 52, an interval at which a position of the analyzing element 52 is changed is set based on the information on the element contained in the specimen S acquired in step S2. For example, a peak position inherent in the element is specified based on the information on the element contained in the specimen S, and a movement interval of the analyzing element 52 at the time of measuring the background of a spectrum is set to be larger than a movement interval of the analyzing element 52 at the time of measuring the peak position.

Figure 36:
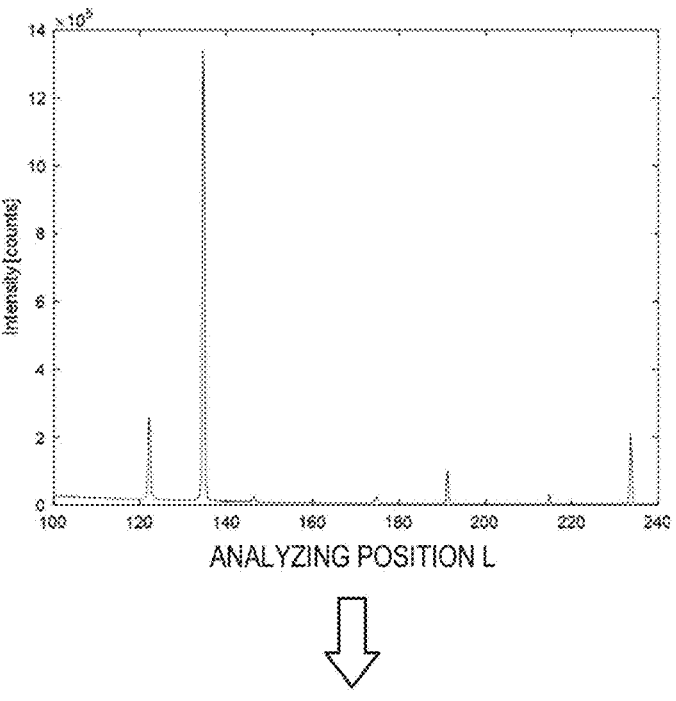
FIG. 36 is a graph for describing a method for setting a movement interval of an analyzing element.
Figure 36:
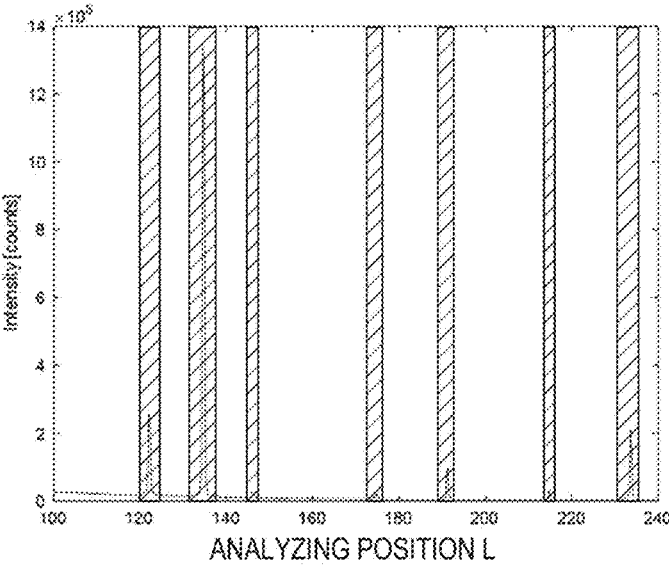

FIG. 36 is a graph for describing a method for setting a movement interval of the analyzing element 52. In FIG. 36, spectrum data of the whole observation visual field of the specimen S acquired by a LiF crystal is illustrated. In FIG. 36, hatching is applied to a peak position and its adjacent regions.

In the peak position and the adjacent regions to which the hatching is applied illustrated in FIG. 36, a movement interval of the analyzing element 52 is set to be smaller than a background region to which hatching is not applied. Thus, compared with a case in which the movement interval of the analyzing element 52 is made constant in the whole measurement energy range, a reduction in the number of times for performing a mapping analysis is allowed. Accordingly, shortening of a time required for spectrum imaging is allowed.

For example, in the background region between the adjacent peak regions, the movement interval of the analyzing element 52 may be set so that a mapping analysis is performed only at the intermediate position between the adjacent peak regions. That is, the background regions may be measured at one point.

3.3. Processing of Control Unit

Figure 37:
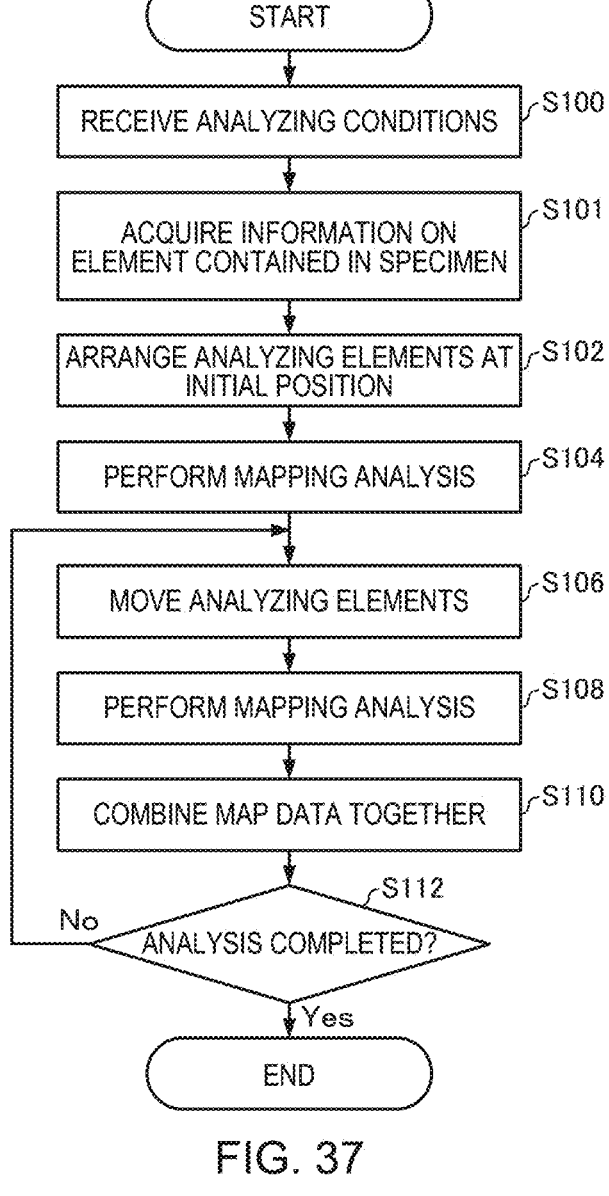
FIG. 37 is a flowchart illustrating an example of spectrum imaging processing of a control unit.

FIG. 37 is a flowchart illustrating an example of spectrum imaging processing of the control unit 60. The processing of the control unit 60 is the same as the above spectrum imaging of the control unit 60 illustrated in FIG. 7 except that processing for receiving information on an element contained in the specimen S is performed, and that an interval at which a position of the analyzing element 52 is changed is set based on the information on the element contained in the specimen S. Hereinafter, the points of the spectrum imaging processing of the control unit 60 that are different from those of the spectrum imaging processing of the control unit 60 illustrated in FIG. 7 will be described, and descriptions of the same points will be omitted.

The control unit 60 acquires information on an element contained in the specimen S after the processing of step S100 to receive a setting of an analyzing condition of spectrum imaging (S101).

The control unit 60 acquires the information on the element contained in the specimen S based on a qualitative analysis when receiving a result of a qualitative analysis of the specimen S by an XRF not shown. Note that the control unit 60 may acquire the information on the element contained in the specimen S based on a result of a qualitative analysis when receiving the result of the qualitative analysis of the specimen S by the EDS 40. Further, the control unit 60 may receive the information on the element contained in the specimen S input by a user via an operation unit 70.

In the processing of step S106 to move the analyzing element 52, the control unit 60 sets an interval at which a position of an analyzing element 52 is changed based on the information on the element contained in the specimen S. For example, the control unit 60 specifies a peak position inherent in the element based on the information on the element contained in the specimen S, and sets a movement interval of the analyzing element 52 at the time of measuring the background of a spectrum to be larger than a movement interval of the analyzing element 52 at the time of measuring the peak position.

3.4. Effects

The analyzing method according to the third embodiment includes the step of acquiring information on an element contained in the specimen S. In the step of acquiring a plurality of map data, an interval at which a position of the analyzing element 52 is changed is set based on the information on the element contained in the specimen S. Therefore, a reduction in the number of times for performing a mapping analysis is allowed in the analyzing method according to the third embodiment. Accordingly, spectrum imaging is allowed in a short period of time in the analyzing method according to the third embodiment.

In the analyzing method according to the third embodiment, information on an element contained in the specimen S is acquired by an analysis based on an XRF or an EDS. Therefore, acquisition of the information on the element contained in the specimen S is allowed in a short period of time in the analyzing method according to the third embodiment.

In the analyzer 100, the control unit 60 performs processing for acquiring information on an element contained in a specimen, specifies a peak position inherent in an element in an X-ray spectrum based on the information, and sets an interval at the time of measuring the background of the X-ray spectrum to be larger than an interval at the time of measuring the peak. Therefore, the analyzer 100 is allowed to reduce the number of times for performing a mapping analysis. Accordingly, the analyzer 100 is allowed to perform spectrum imaging in a short period of time.

The above-described embodiments and modifications are examples and the invention is not limited thereto. For example, the embodiments and the modifications may be combined appropriately.

The invention is not limited to the above-described embodiments, and various modifications can be made. For example, the invention includes configurations that are substantially the same as the configurations described in the embodiments. Substantially same configurations mean configurations having the same functions, methods and results, or configurations having the same objectives and effects as those of the configurations described in the embodiments, for example. The invention also includes configurations obtained by replacing non-essential elements of the configurations described in the embodiments with other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

What is claimed is:

1. An analyzing method using an analyzer comprising a wavelength-dispersive X-ray spectrometer that has an analyzing element to analyze an X-ray emitted from a specimen and detects an X-ray of energy corresponding to a position of the analyzing element, the analyzing method comprising:

acquiring a plurality of map data by repeatedly performing a mapping analysis while changing the position of the analyzing element in between each mapping analysis, the mapping analysis being an analysis to detect an X-ray of specific energy with the position of the analyzing element fixed to acquire map data while scanning the specimen with an electron beam; and generating, based on the plurality of map data, a spectrum map in which a position on the specimen and an X-ray spectrum are associated with each other, wherein, in the acquisition of the plurality of map data, the specimen is scanned with an electron beam by deflecting the electron beam with a deflector, the analyzing method further comprising correcting a spectrum shift resulting from deflection of the electron beam in an X-ray spectrum stored in each pixel of the spectrum map, wherein, in the correction of the spectrum shift, the spectrum shift is corrected based on information showing a relationship between a deflection amount of the electron beam and a spectrum shift amount.

2. The analyzing method according to claim 1, wherein the wavelength-dispersive X-ray spectrometer comprises a plurality of wavelength-dispersive X-ray spectrometers, and the acquisition of the plurality of map data and the generation of the spectrum map are performed for each of the wavelength-dispersive X-ray spectrometers.

3. The analyzing method according to claim 1, further comprising:

correcting a spectrum shift resulting from displacement of a height of the specimen in an X-ray spectrum stored in each pixel of the spectrum map, wherein, in the correction of the spectrum shift, the spectrum shift is corrected based on information showing a relationship between a displacement amount of the height of the specimen and a spectrum shift amount.

4. The analyzing method according to claim 3, further comprising:

acquiring the information showing the relationship between the displacement amount of the height of the specimen and the spectrum shift amount, wherein, in the acquisition of the information showing the relationship between the displacement amount of the height of the specimen and the spectrum shift amount, an X-ray emitted from a standard specimen when the standard specimen is irradiated with an electron beam in a state in which the height of the specimen is not displaced is detected while changing the position of the analyzing element to acquire a reference spectrum, an analysis to detect an X-ray emitted from the standard specimen when the standard specimen is irradiated with an electron beam in a state in which the height of the specimen is displaced while changing the position of the analyzing element to acquire a comparison spectrum is repeatedly performed while changing the displacement amount of the height of the specimen to acquire a plurality of comparison spectra, and the reference spectrum is compared with each of the comparison spectra to acquire the information showing the relationship between the displacement amount of the height of the specimen and the spectrum shift amount.

5. The analyzing method according to claim 1, further comprising:

calculating a spectrum shift amount by comparing the X-ray spectrum stored in each pixel of the spectrum map with a reference spectrum; and generating, based on the spectrum shift amount, a map in which a position on the specimen and the height of the specimen are associated with each other.

6. The analyzing method according to claim 1, further comprising:

acquiring the information showing the relationship between the deflection amount of the electron beam and the spectrum shift amount, wherein, in the acquisition of the information showing the relationship between the deflection amount of the electron beam and the spectrum shift amount, an X-ray emitted from a standard specimen when the standard specimen is irradiated with an electron beam in a state in which the electron beam is not deflected is detected while changing the position of the analyzing element to acquire a reference spectrum, an analysis to detect an X-ray emitted from the standard specimen when the standard specimen is irradiated with an electron beam in a state in which the electron beam is deflected while changing the position of the analyzing element to acquire a comparison spectrum is repeatedly performed while changing a deflection amount of the electron beam to acquire a plurality of comparison spectra, and a spectrum shift amount of each of the comparison spectra with respect to the reference spectrum is calculated to acquire the information showing the relationship between the deflection amount of the electron beam and the spectrum shift amount.

7. The analyzing method according to claim 1, further comprising correcting a reduction in X-ray intensity resulting from deflection of the electron beam in an X-ray spectrum stored in each pixel of the spectrum map, wherein, in the correction of the reduction in the X-ray intensity, the reduction in the X-ray intensity is corrected based on information showing a relationship between a deflection amount of the electron beam and a reduction ratio of the X-ray intensity.

8. The analyzing method according to claim 7, further comprising:

acquiring the information showing the relationship between the deflection amount of the electron beam and the reduction ratio of the X-ray intensity, wherein, in the acquisition of the information showing the relationship between the deflection amount of the electron beam and the reduction ratio of the X-ray intensity, an X-ray emitted from a standard specimen when the standard specimen is irradiated with an electron beam in a state in which the electron beam is not deflected is detected while changing the position of the analyzing element to acquire a reference spectrum, an analysis to detect an X-ray emitted from the standard specimen when the standard specimen is irradiated with an electron beam in a state in which the electron beam is deflected while changing the position of the analyzing element to acquire a comparison spectrum is repeatedly performed while changing the deflection amount of the electron beam to acquire a plurality of comparison spectra, and X-ray intensity of the reference spectrum is compared with X-ray intensity of each of the comparison spectra to acquire the information showing the relationship between the deflection amount of the electron beam and the reduction ratio of the X-ray intensity.

9. The analyzing method according to claim 1, further comprising:

acquiring information on an element contained in the specimen, wherein, in the acquisition of the plurality of map data, an interval at which the position of the analyzing element is changed is set based on the information on the element contained in the specimen.

10. The analyzing method according to claim 9, wherein, in the acquisition of the information on the element contained in the specimen, the information on the element contained in the specimen is acquired by an analysis using an X-ray fluorescence spectrometer or an energy-dispersive X-ray spectrometer.

11. The analyzing method according to claim 9, wherein, in the acquisition of the plurality of map data, a peak position inherent in the element in the X-ray spectrum is specified based on the information on the element contained in the specimen, and the interval at a time of measuring a background of the X-ray spectrum is set to be larger than the interval at a time of measuring the inherent peak.

12. An analyzer comprising:

an electron optical system that irradiates a specimen with an electron beam;

a wavelength-dispersive X-ray spectrometer that has an analyzing element to analyze an X-ray emitted from the specimen and detects an X-ray of energy corresponding to a position of the analyzing element;

a storage that stores information; and a control unit that controls the electron optical system and the wavelength-dispersive X-ray spectrometer, the control unit performing processing for:

acquiring a plurality of map data by repeatedly performing a mapping analysis while causing the wavelength-dispersive X-ray spectrometer to change the position of the analyzing element in between each mapping analysis, the mapping analysis being an analysis to cause the wavelength-dispersive X-ray spectrometer to detect an X-ray of specific energy with the position of the analyzing element fixed to acquire map data while scanning the specimen with an electron beam; and generating, based on the plurality of map data, a spectrum map in which a position on the specimen and an X-ray spectrum are associated with each other, wherein, the storage unit stores information showing a relationship between a displacement amount of a height of the specimen and a spectrum shift amount.

13. The analyzer according to claim 12, wherein the wavelength-dispersive X-ray spectrometer comprises a plurality of wavelength-dispersive X-ray spectrometers, and the processing for acquiring the plurality of map data and the processing for generating the spectrum map are performed for each of the wavelength-dispersive X-ray spectrometers.

14. The analyzer according to claim 12, wherein the control unit performs processing for acquiring information on an element contained in the specimen, and sets an interval at which the position of the analyzing element is changed based on the information on the element contained in the specimen.

15. The analyzer according to claim 14, wherein the control unit specifies a peak position inherent in the element in the X-ray spectrum based on the information on the element contained in the specimen, and sets the interval at a time of measuring a background of the X-ray spectrum to be larger than the interval at a time of measuring the inherent peak.

16. An analyzer comprising:

an electron optical system that irradiates a specimen with an electron beam;

a deflector that deflects the electron beam;

a wavelength-dispersive X-ray spectrometer that has an analyzing element to analyze an X-ray emitted from the specimen and detects an X-ray of energy corresponding to a position of the analyzing element;

a storage that stores information; and a control unit that controls the electron optical system and the wavelength-dispersive X-ray spectrometer, the control unit performing processing for:

acquiring a plurality of map data by repeatedly performing a mapping analysis while causing the wavelength-dispersive X-ray spectrometer to change the position of the analyzing element in between each mapping analysis, the mapping analysis being an analysis to cause the wavelength-dispersive X-ray spectrometer to detect an X-ray of specific energy with the position of the analyzing element fixed to acquire map data while scanning the specimen with an electron beam; and generating, based on the plurality of map data, a spectrum map in which a position on the specimen and an X-ray spectrum are associated with each other, wherein, the storage unit stores information showing a relationship between a deflection amount of the electron beam and the spectrum shift amount.

17. The analyzer according to claim 16, wherein the storage unit further stores information showing a relationship between a deflection amount of an electron beam and a reduction ratio of X-ray intensity.

\* \* \* \* \*